United States Patent
Hyakudai et al.

(10) Patent No.: US 10,142,027 B2
(45) Date of Patent: Nov. 27, 2018

(54) COMMUNICATION DEVICE AND COMMUNICATION SYSTEM

(71) Applicant: Sony Corporation, Tokyo (JP)

(72) Inventors: Toshihisa Hyakudai, Kanagawa (JP); Masanari Yamamoto, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 15/554,518

(22) PCT Filed: Mar. 3, 2016

(86) PCT No.: PCT/JP2016/056574
§ 371 (c)(1),
(2) Date: Aug. 30, 2017

(87) PCT Pub. No.: WO2016/152439
PCT Pub. Date: Sep. 29, 2016

(65) Prior Publication Data
US 2018/0076899 A1    Mar. 15, 2018

(30) Foreign Application Priority Data
Mar. 26, 2015    (JP) .................. 2015-064082

(51) Int. Cl.
*H04B 10/50*    (2013.01)
*H03K 17/30*    (2006.01)
*H03K 5/1534*    (2006.01)
*H03K 19/20*    (2006.01)

(52) U.S. Cl.
CPC .......... *H04B 10/501* (2013.01); *H03K 17/30* (2013.01); *H04B 10/50* (2013.01); *H03K 5/1534* (2013.01); *H03K 19/20* (2013.01)

(58) Field of Classification Search
CPC .... H04B 10/501; H03K 17/30; H03K 5/1534; H03K 19/20
USPC .......................................... 398/140
See application file for complete search history.

(56) References Cited

U.S. PATENT DOCUMENTS

| | | | |
|---|---|---|---|
| 2010/0150552 A1* | 6/2010 | Furuyama | H04B 10/808 398/38 |
| 2011/0150401 A1* | 6/2011 | Furuyama | H04B 10/801 385/89 |
| 2013/0183045 A1* | 7/2013 | Niiho | G02B 6/28 398/142 |
| 2014/0168567 A1* | 6/2014 | Kikuchi | H05B 33/0815 349/61 |

FOREIGN PATENT DOCUMENTS

| | | |
|---|---|---|
| JP | 04-155874 A | 5/1992 |
| JP | 2004-179733 A | 6/2004 |

(Continued)

*Primary Examiner* — Dalzid Singh
(74) *Attorney, Agent, or Firm* — Michael Best & Friedrich LLP

(57) ABSTRACT

A communication device of the disclosure includes: a first terminal that outputs a power supply voltage; a second terminal coupled directly or indirectly to the first terminal; a communication section that operates on a basis of the power supply voltage to communicate with a communication peer; and a communication controller that sets the communication section to be in an ON state or in an OFF state on a basis of a voltage on the second terminal.

21 Claims, 24 Drawing Sheets

(56) References Cited

FOREIGN PATENT DOCUMENTS

| | | | |
|---|---|---|---|
| JP | 2006-310197 | A | 11/2006 |
| JP | 2010-141692 | A | 6/2010 |
| JP | 2011-130297 | A | 6/2011 |

* cited by examiner

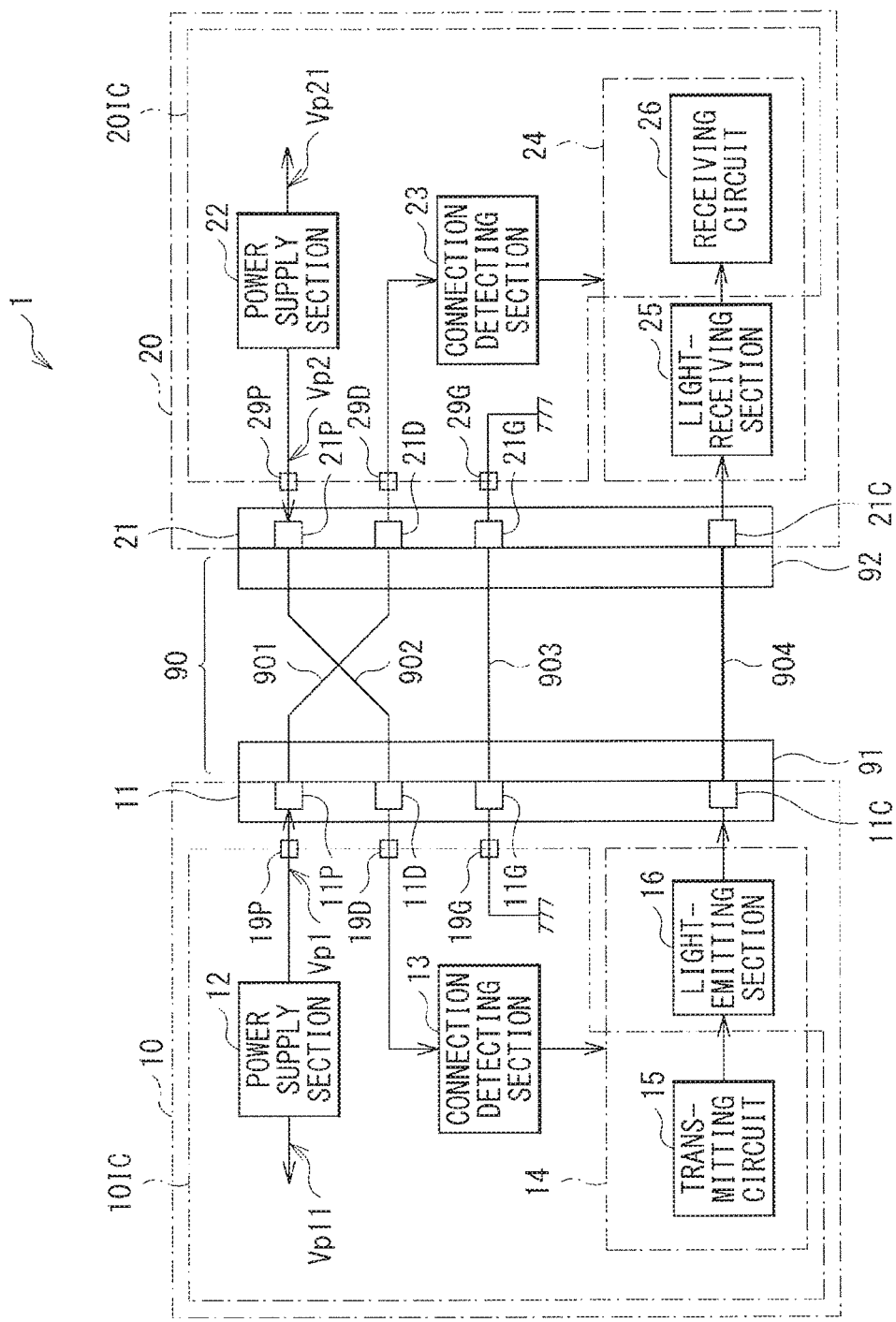

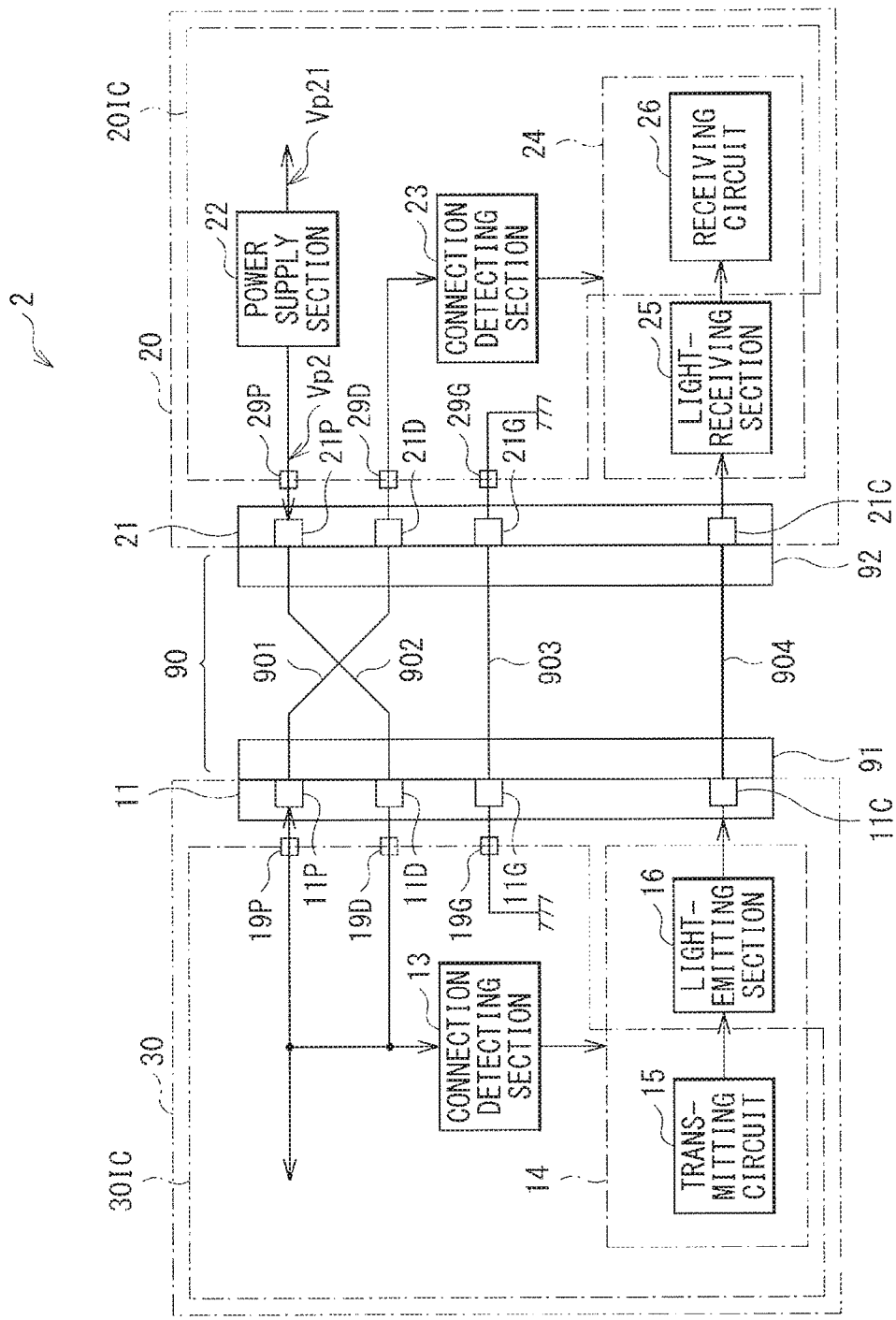
[FIG. 2]

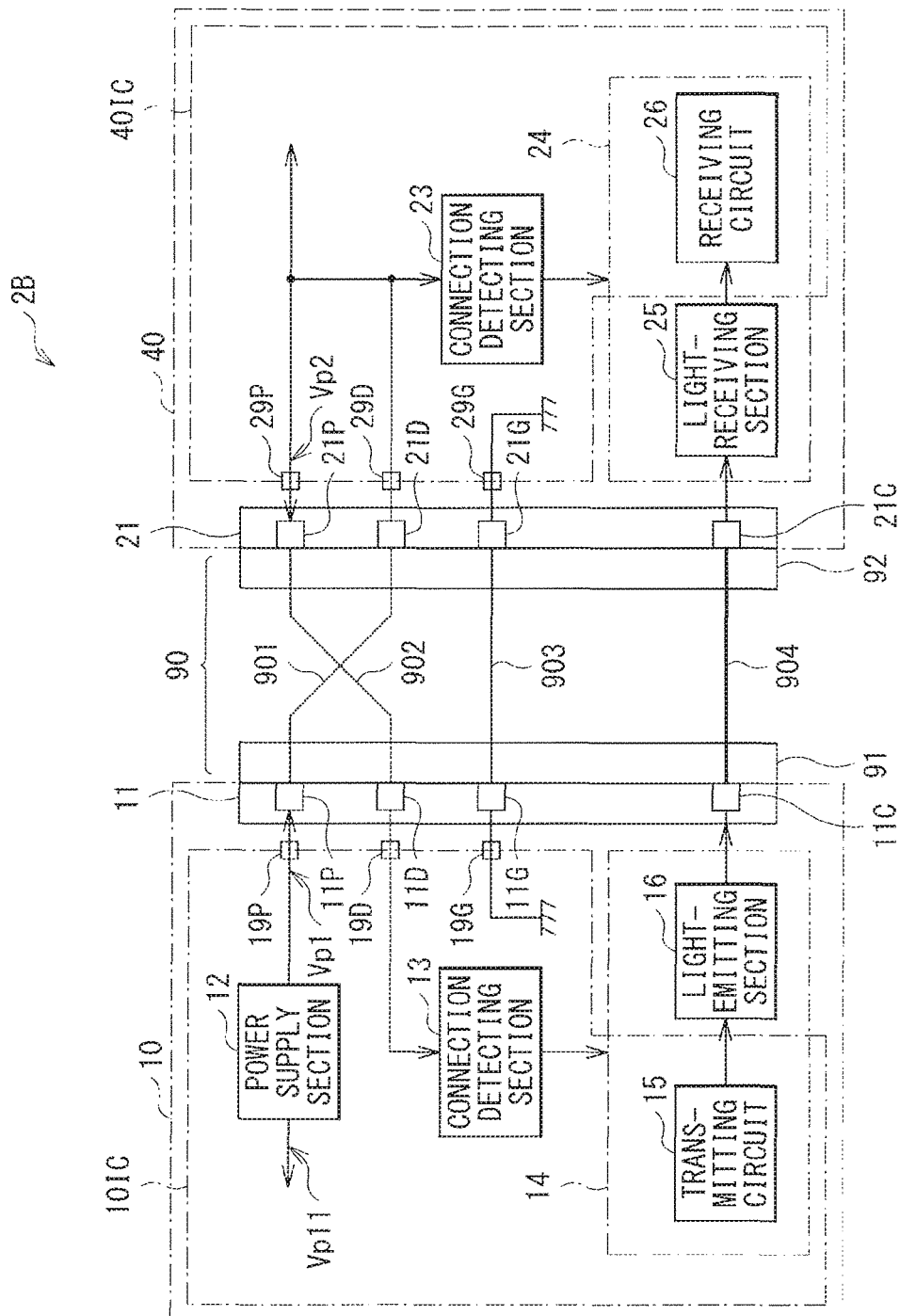
[FIG. 3]

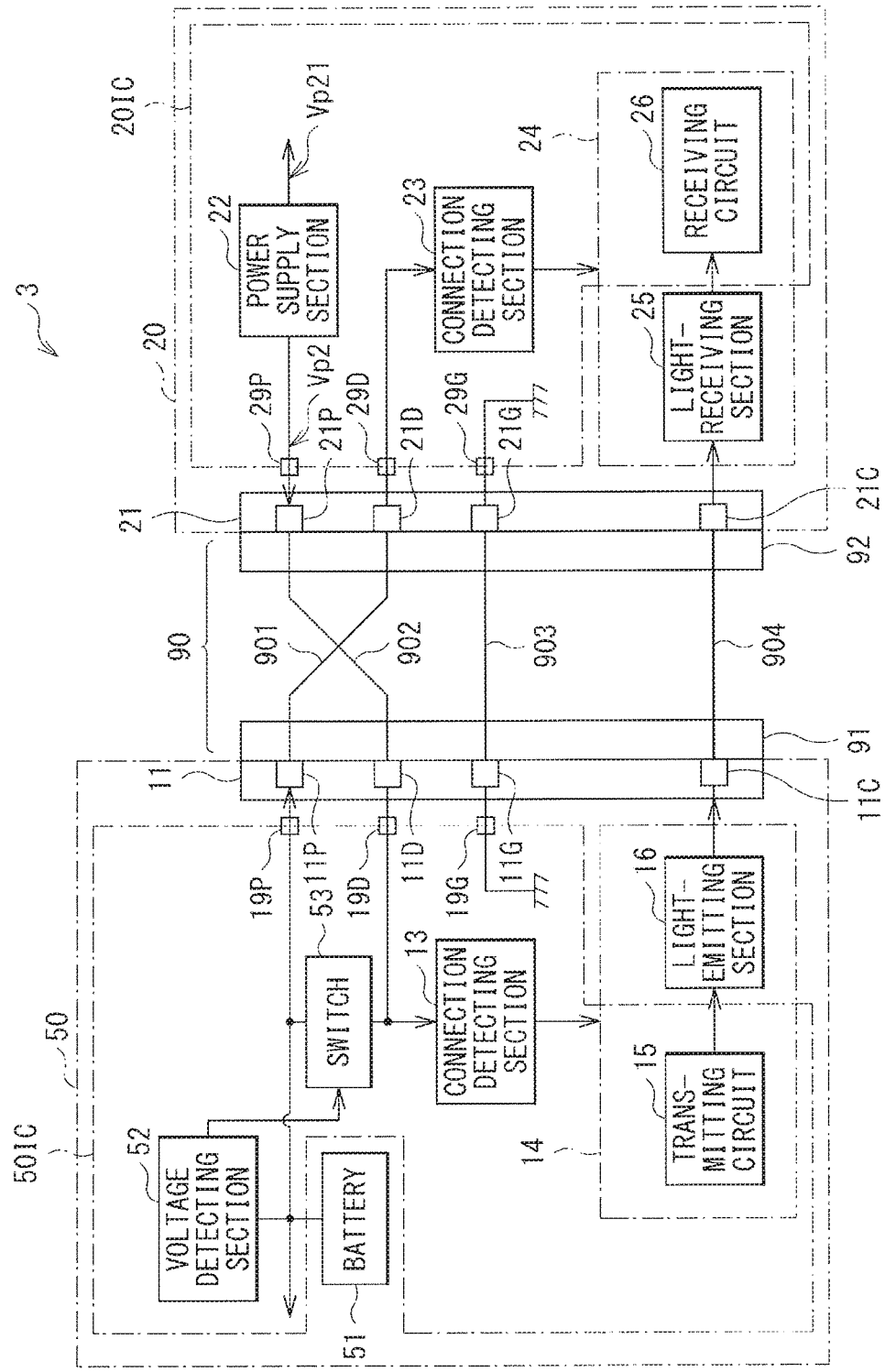
[FIG. 4]

[ FIG. 5A ]
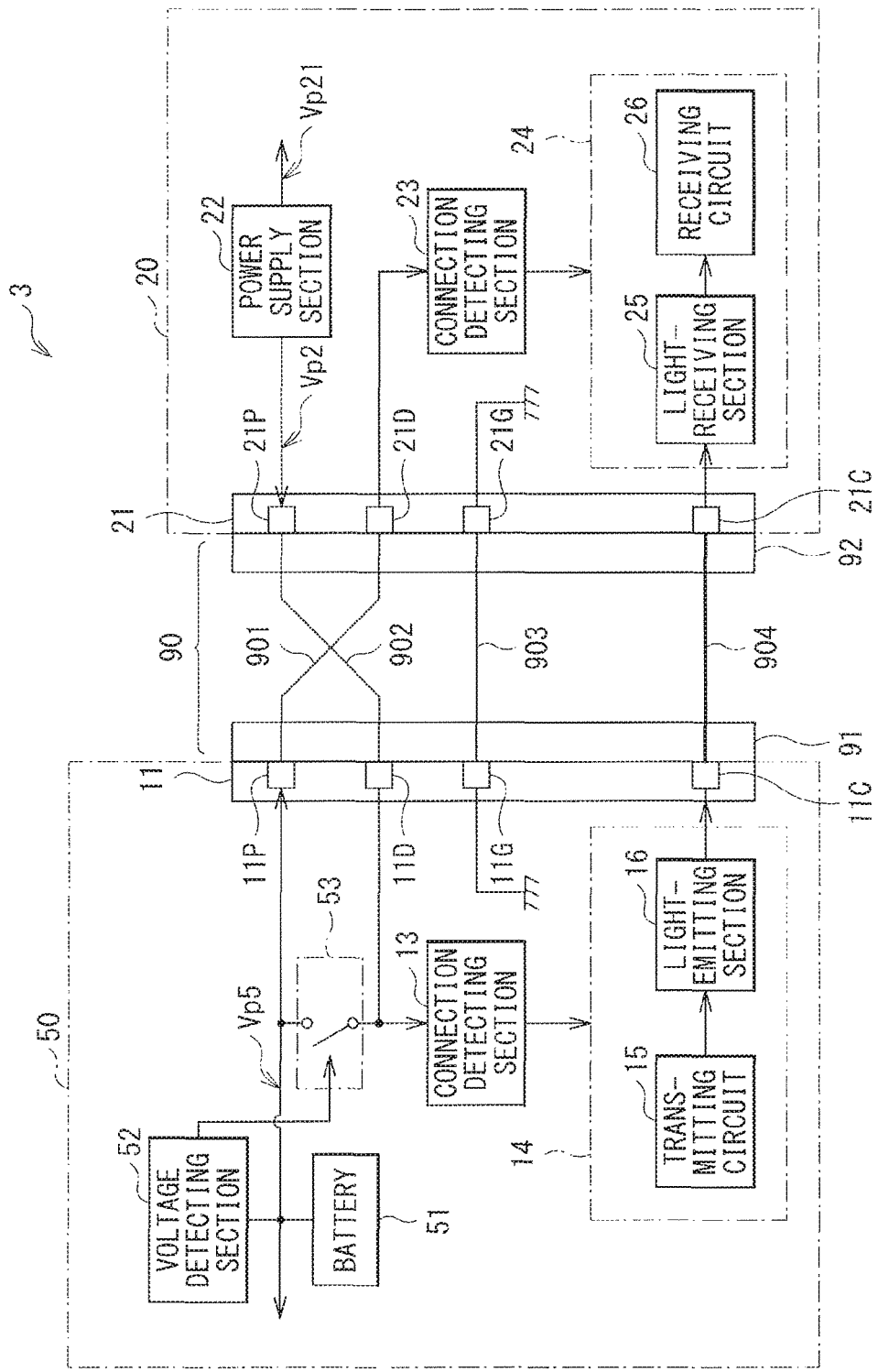

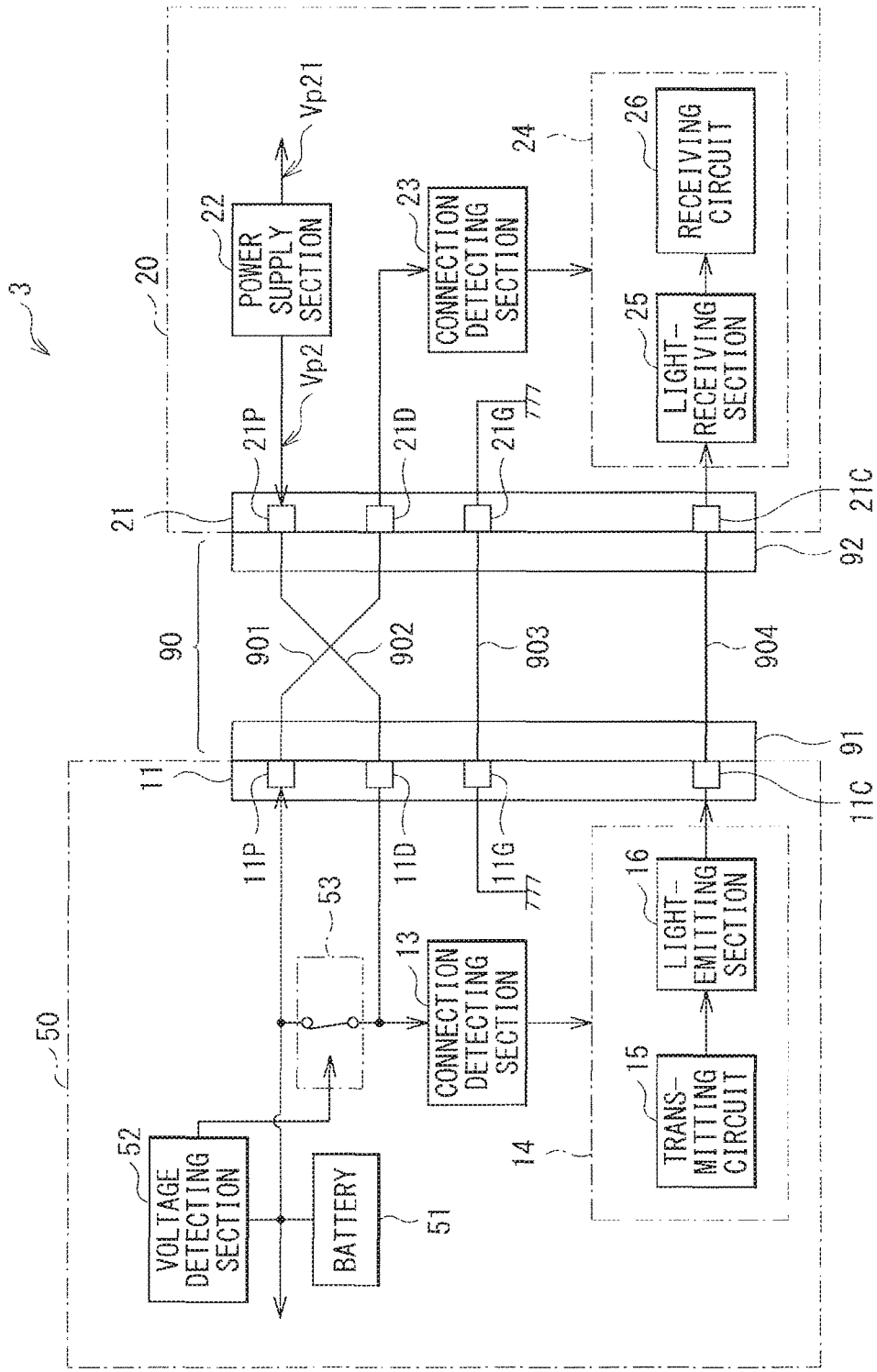
[ FIG. 5B ]

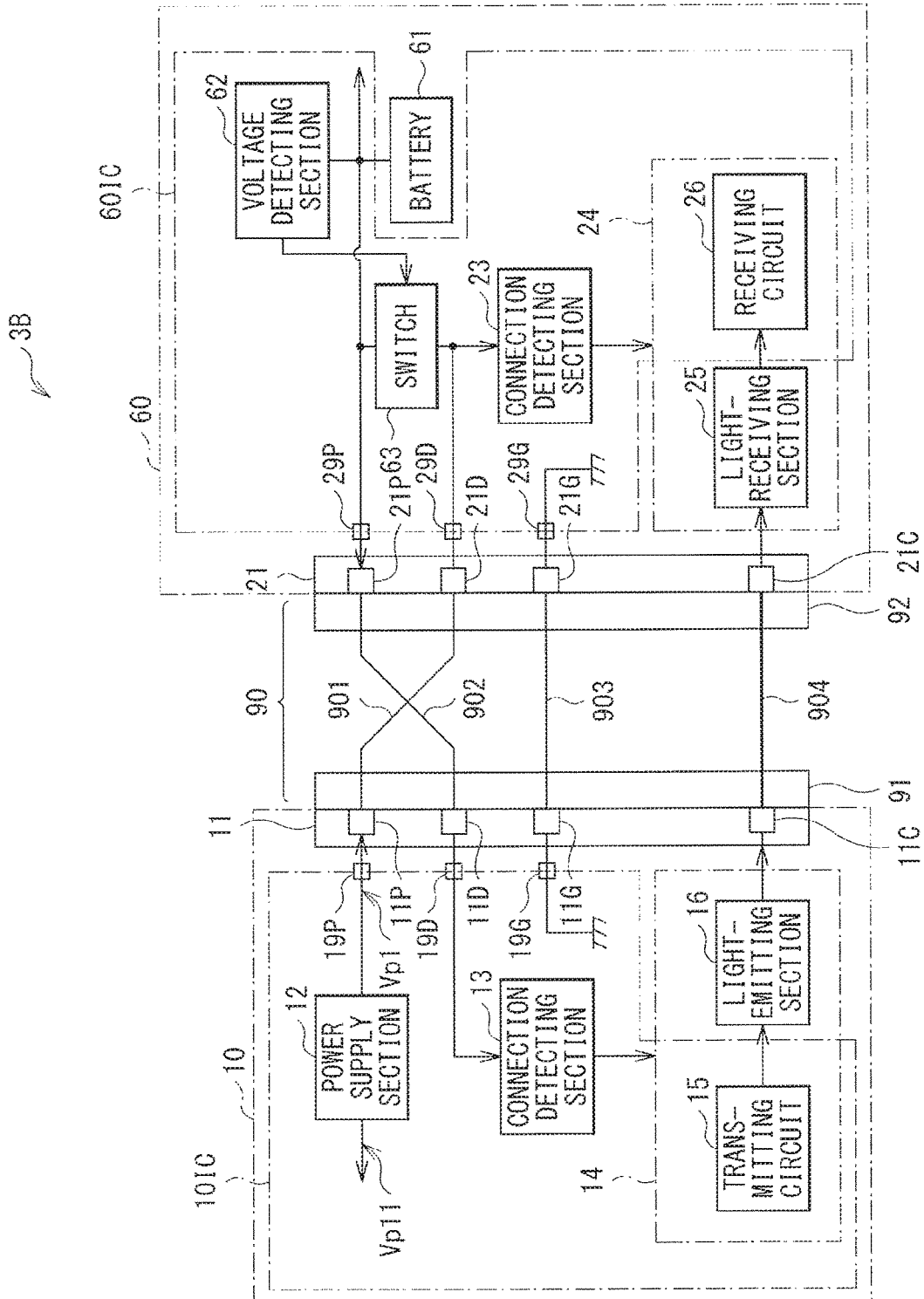
[FIG. 6]

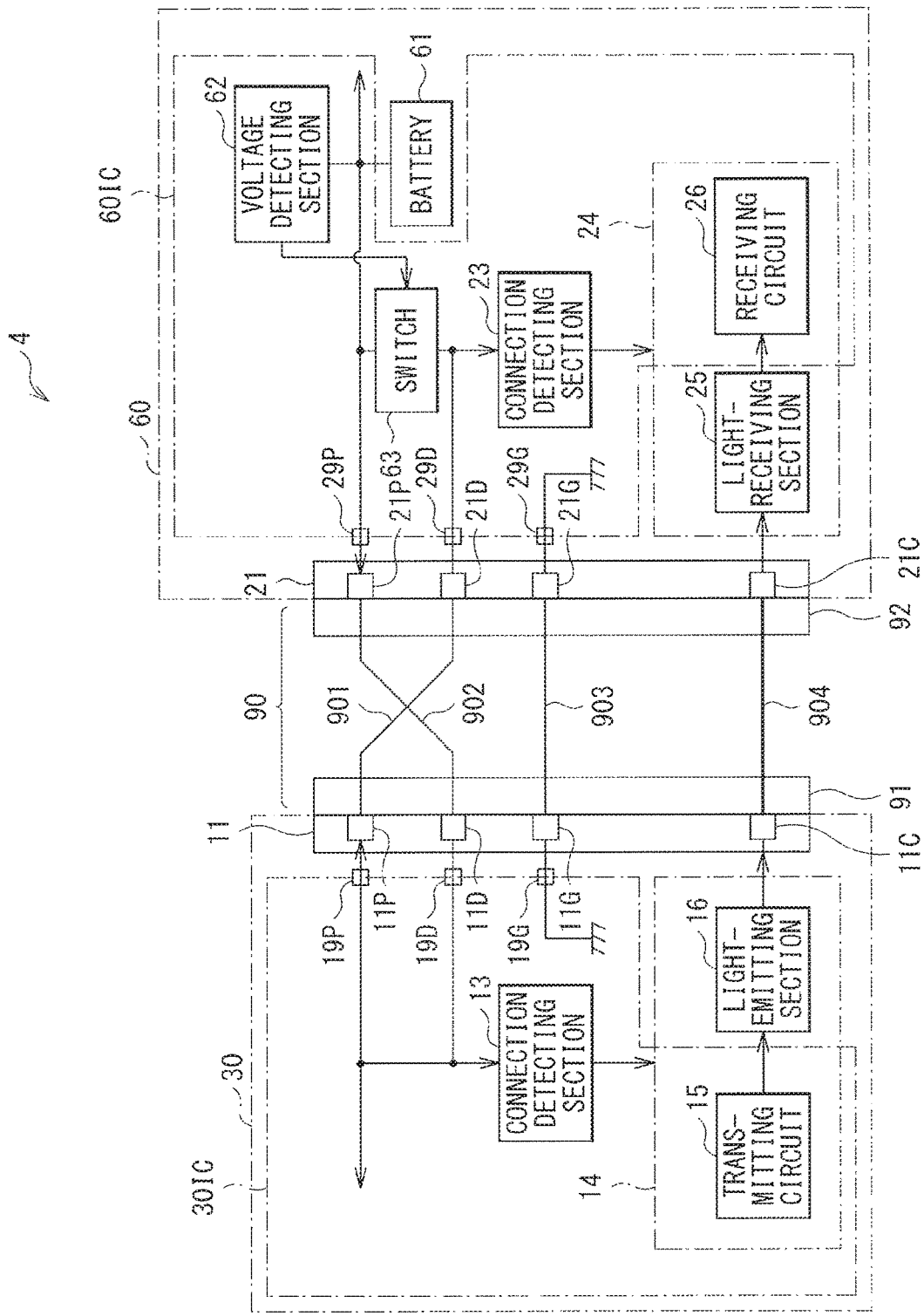
[FIG. 7]

[ FIG. 8A ]
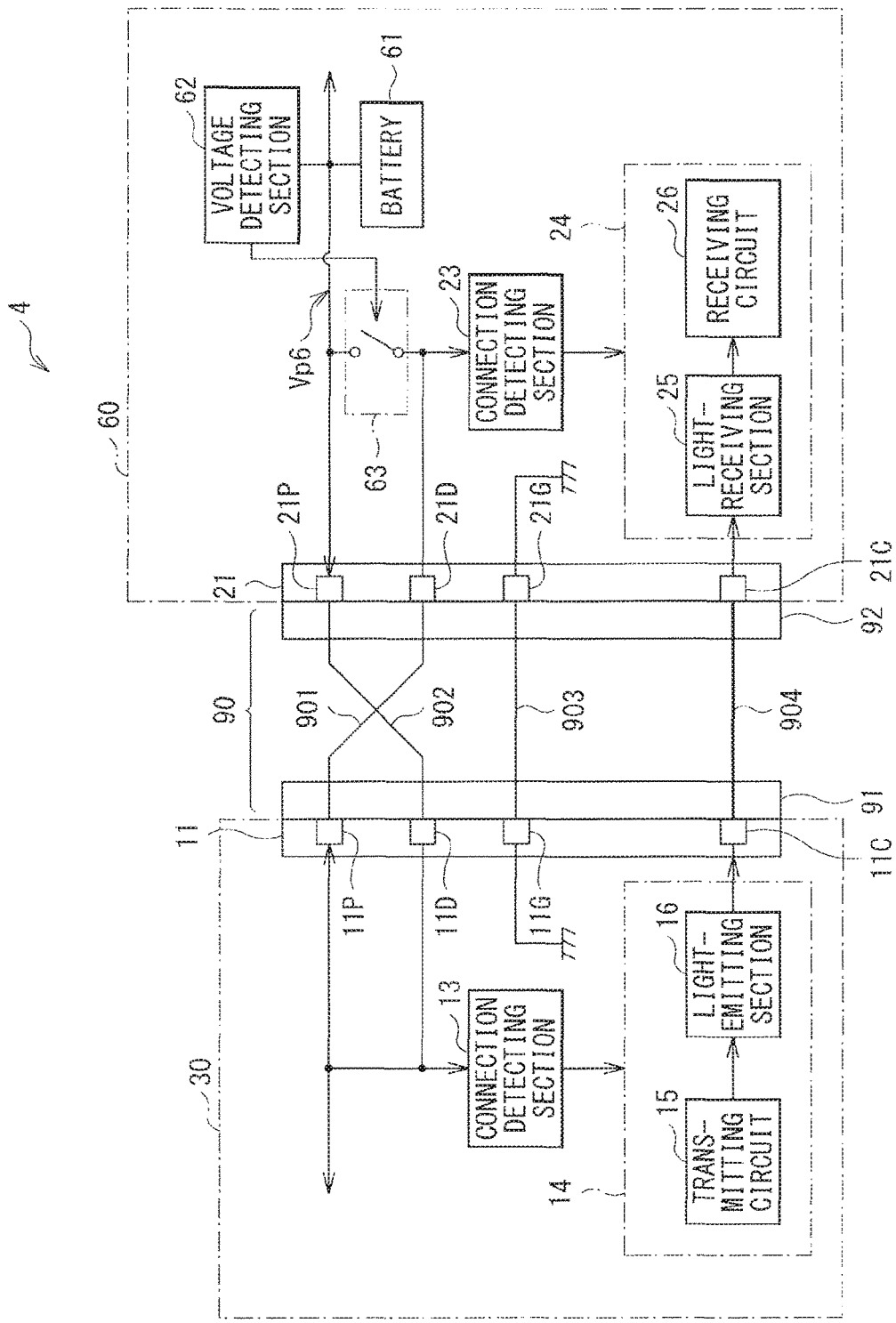

[FIG. 8B]
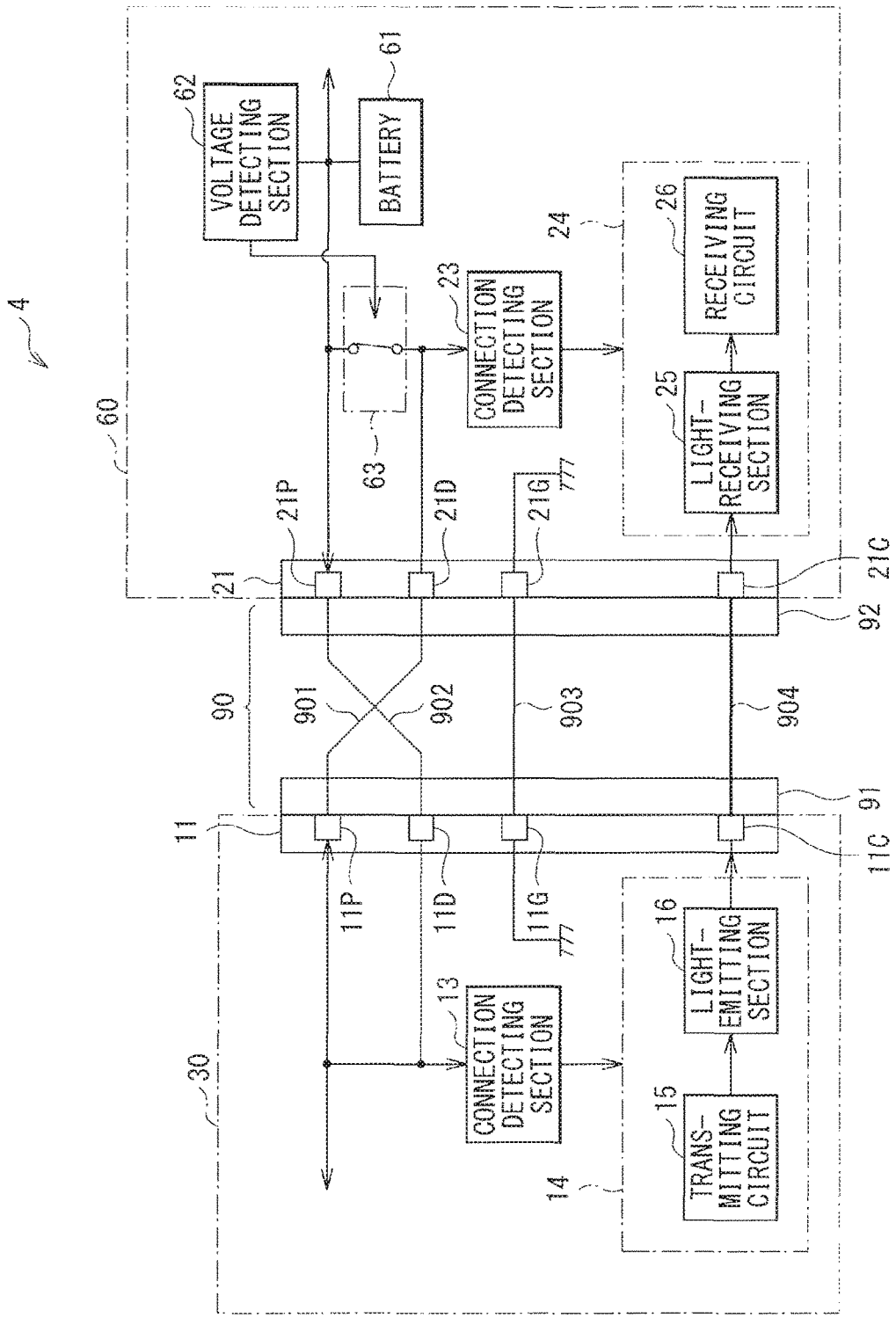

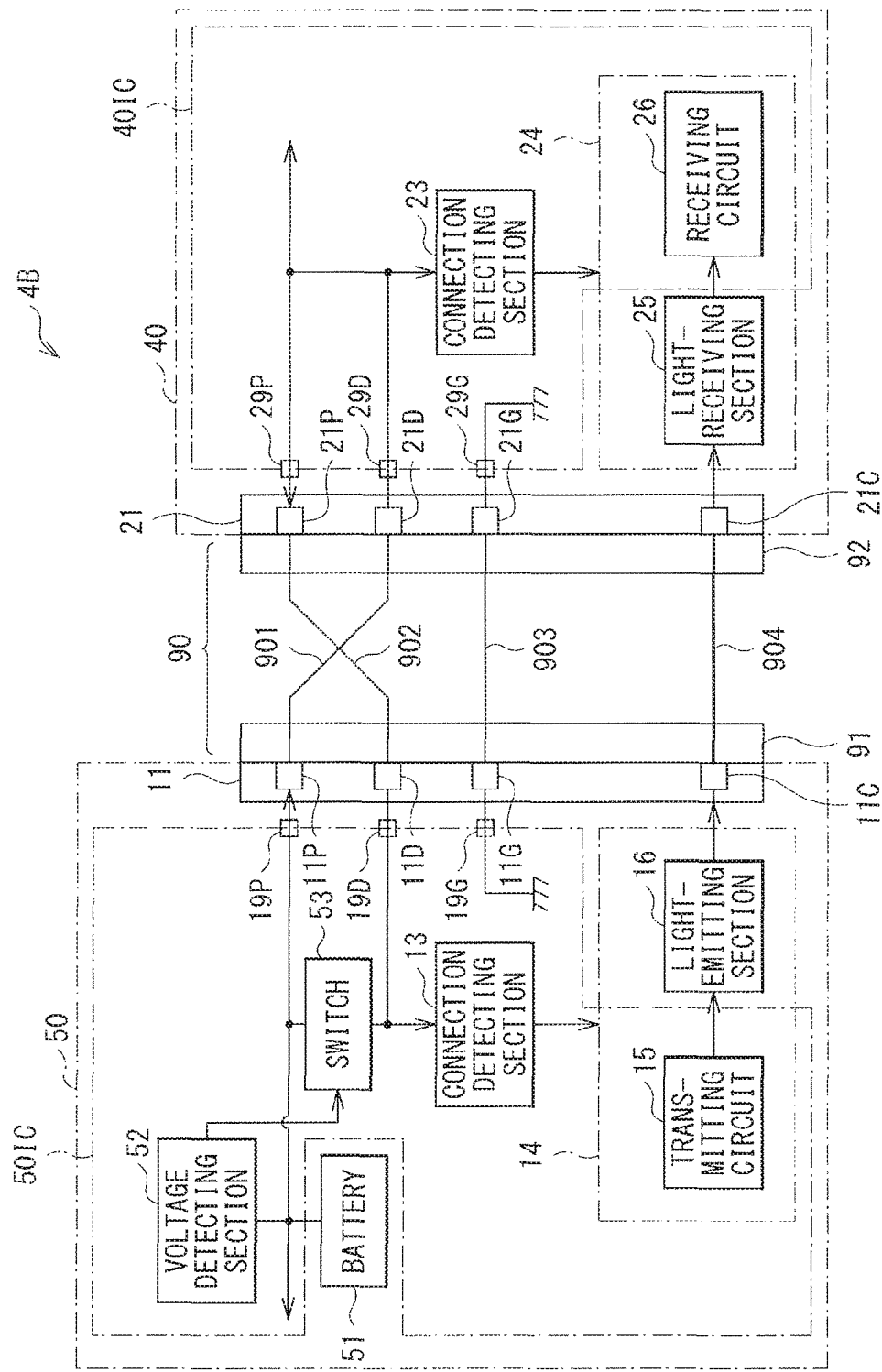
[FIG.9]

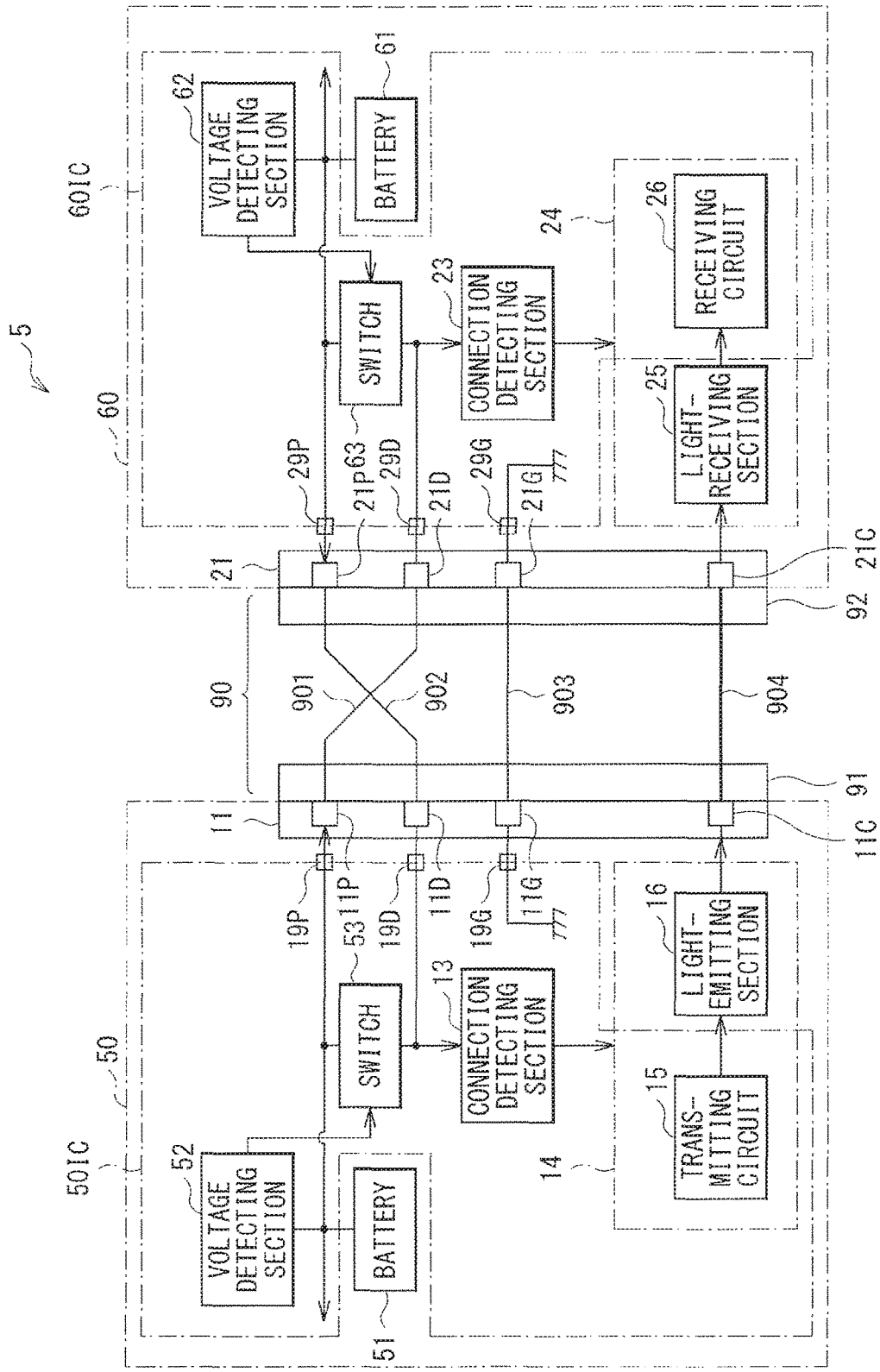

[ FIG. 11A ]
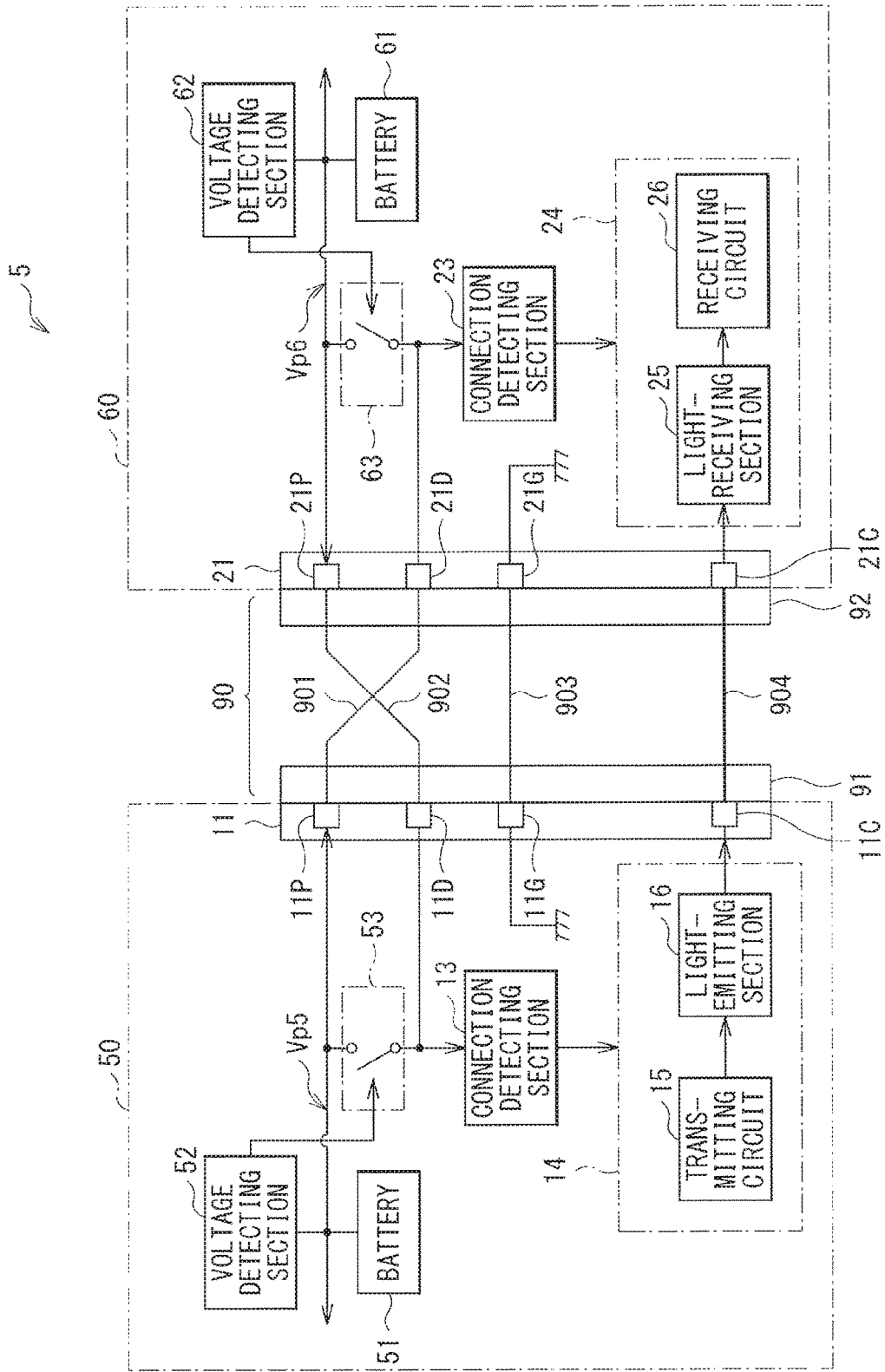

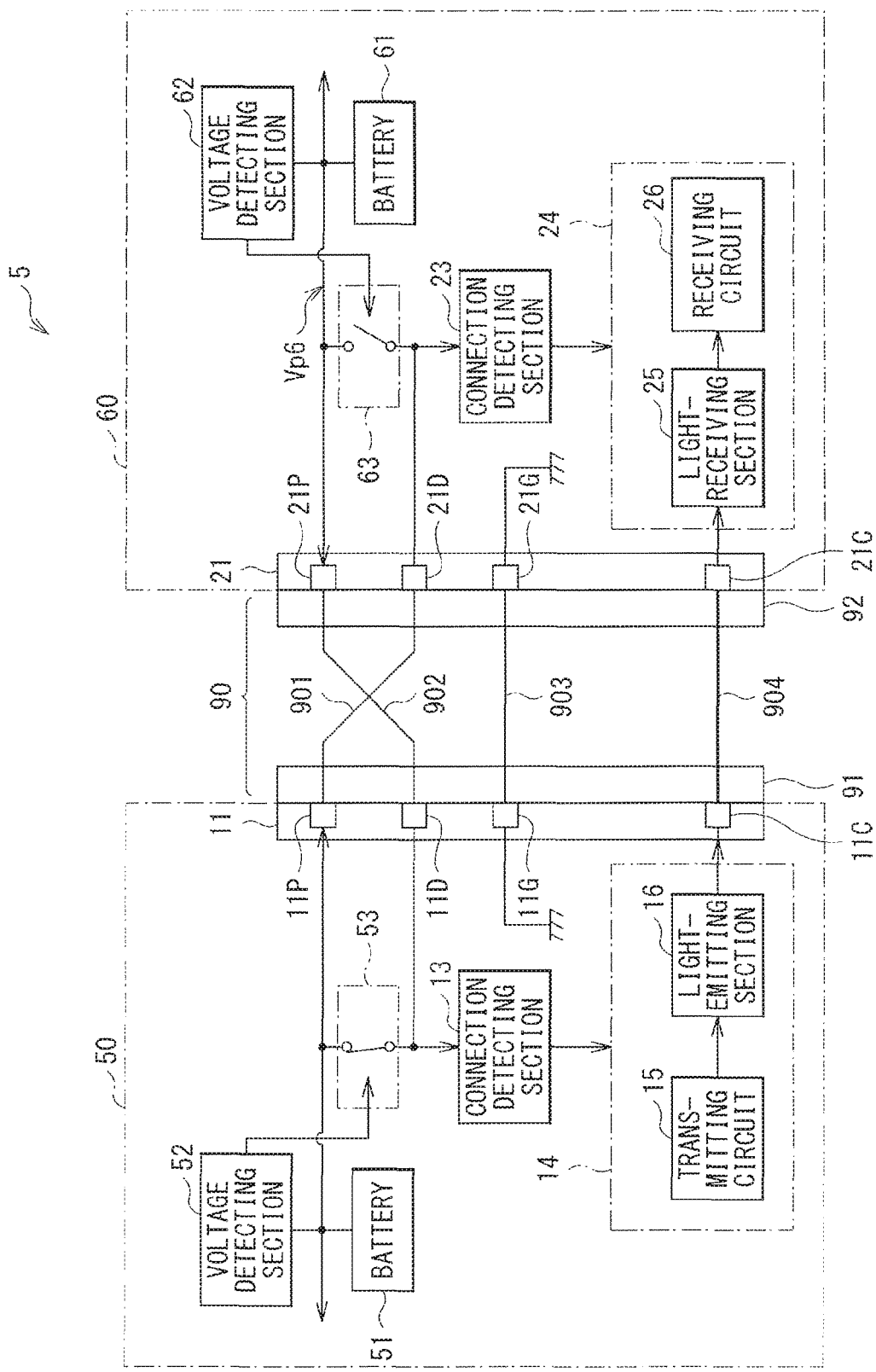
[FIG. 11B]

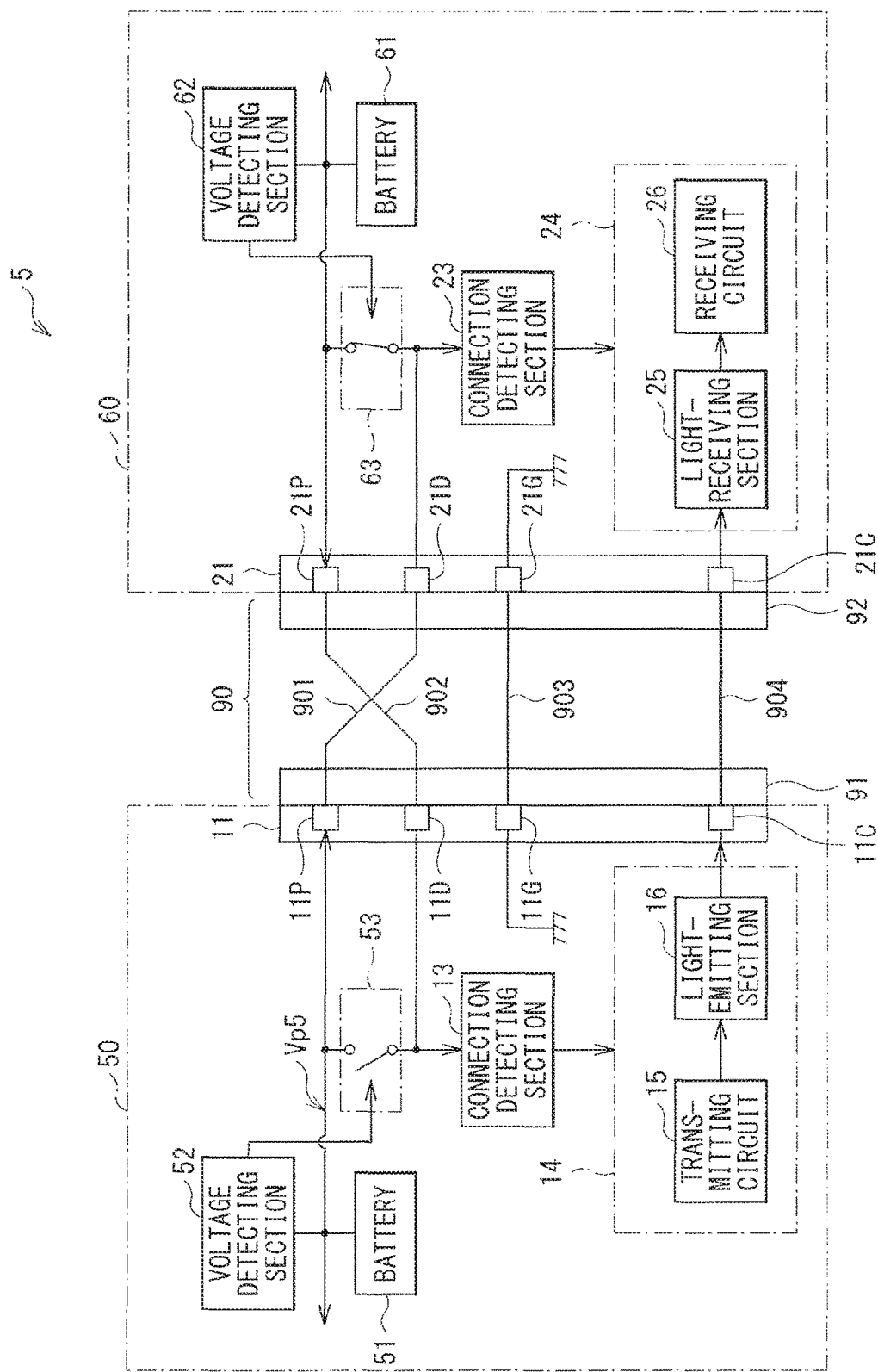
[FIG. 11C]

[ FIG. 11D ]
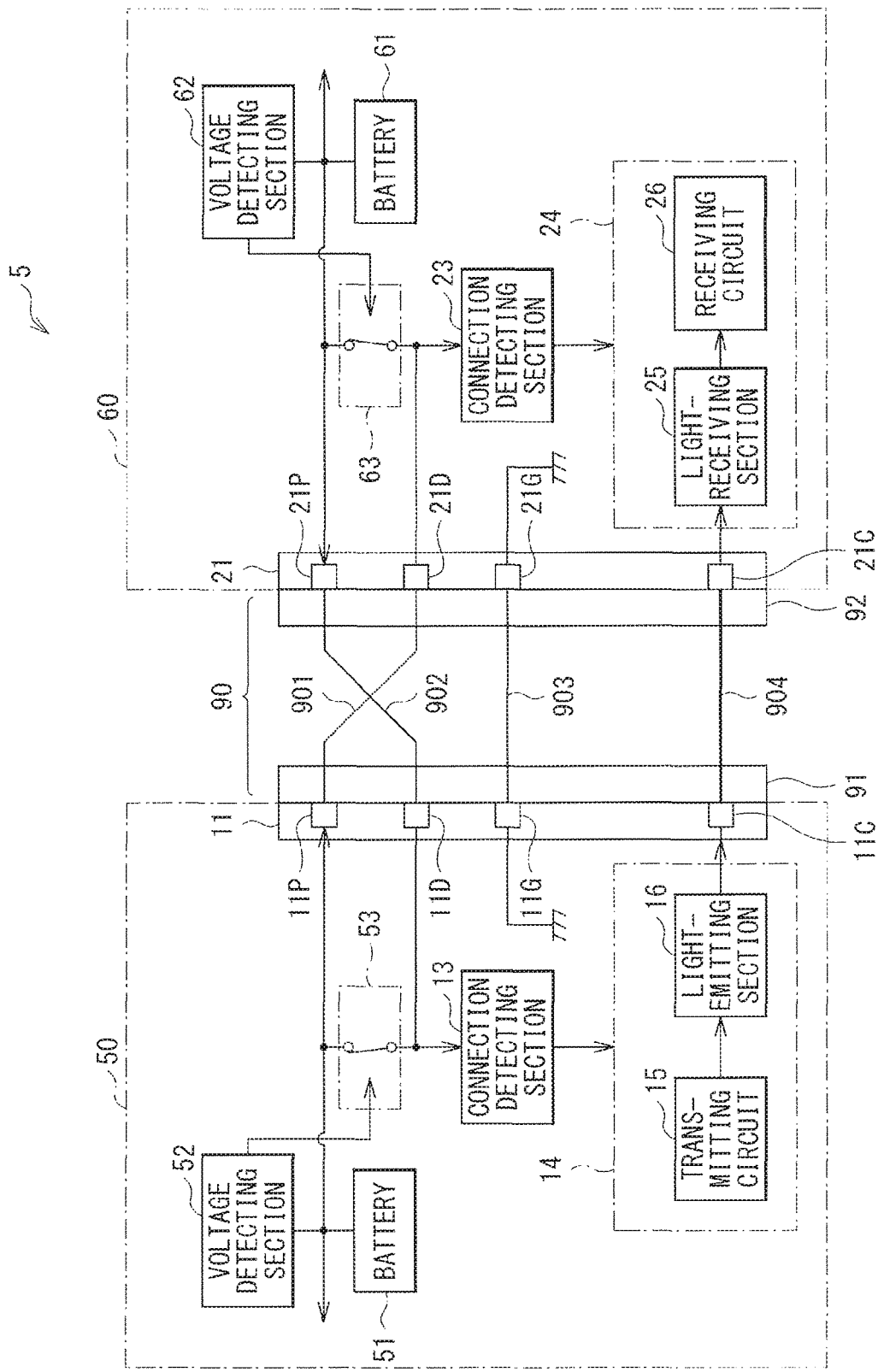

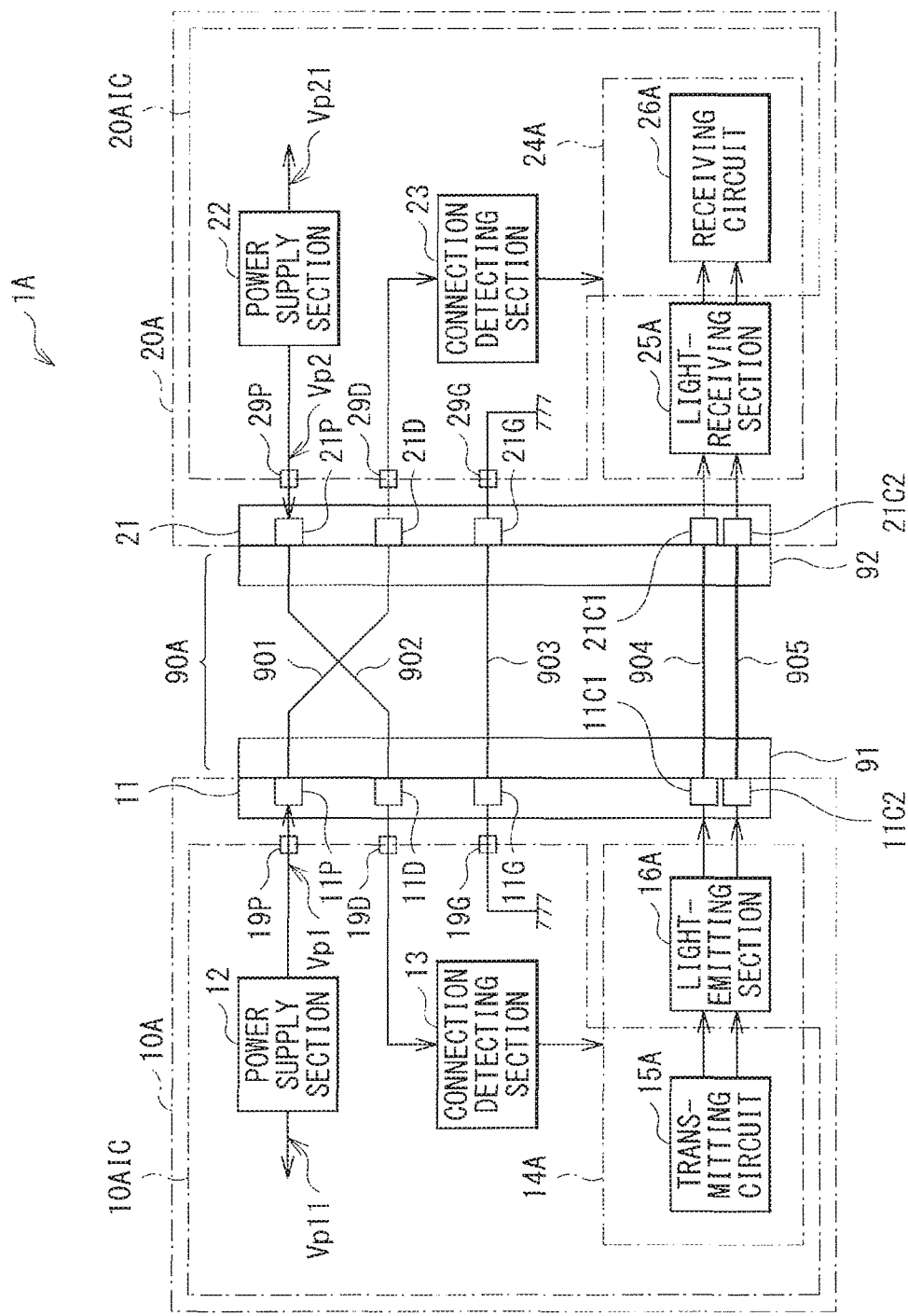
[FIG. 12]

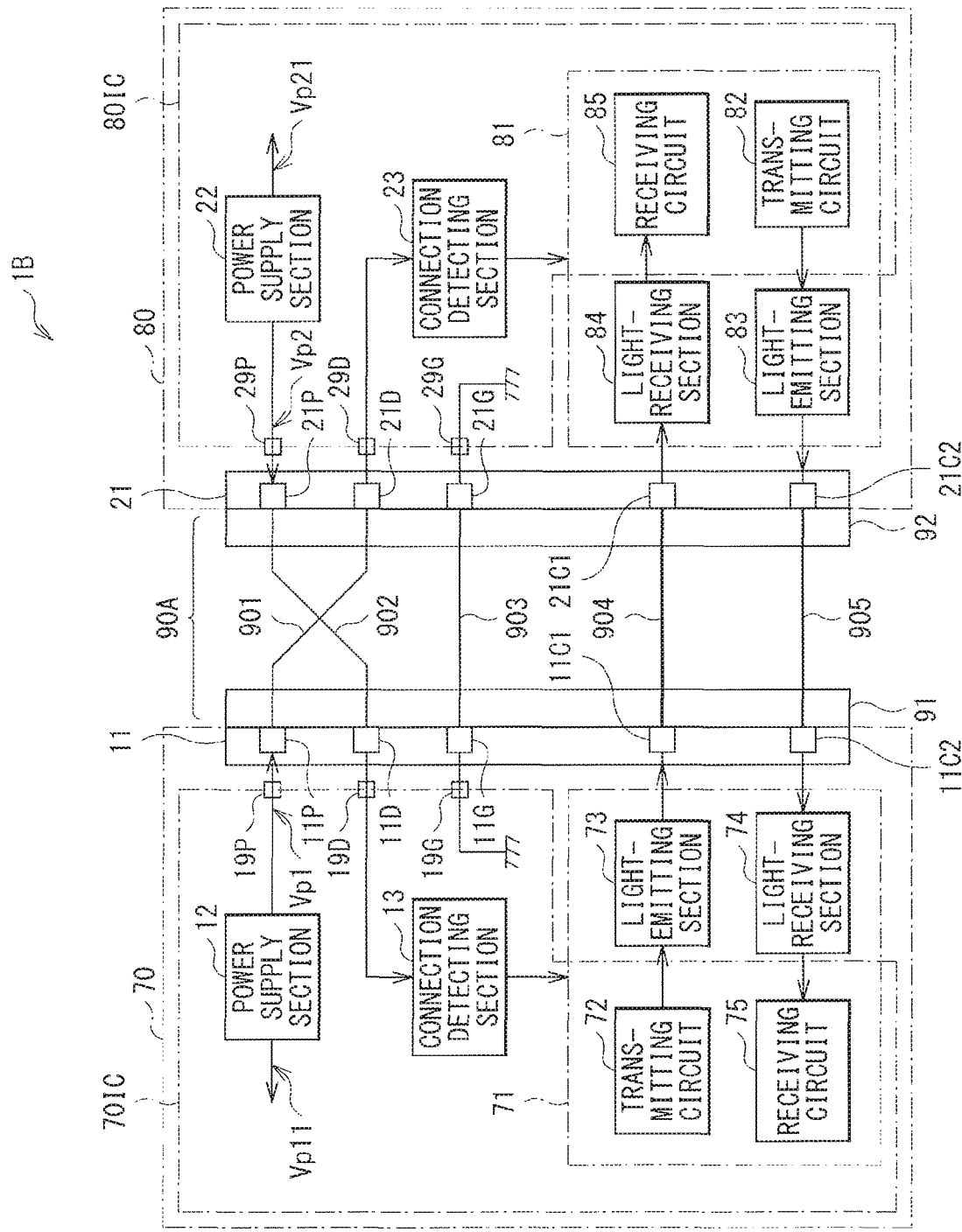
[FIG. 13]

[ FIG. 14A ]
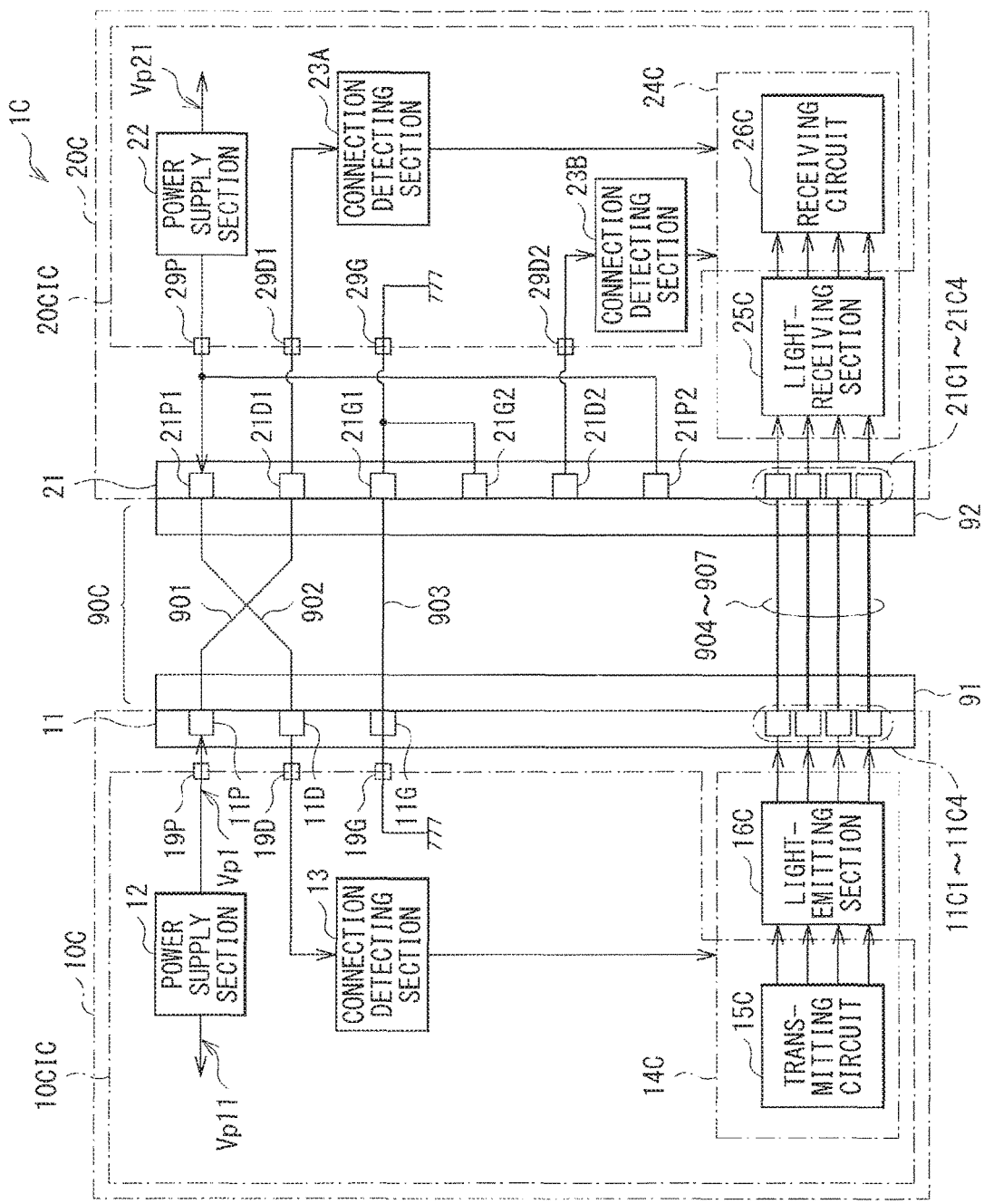

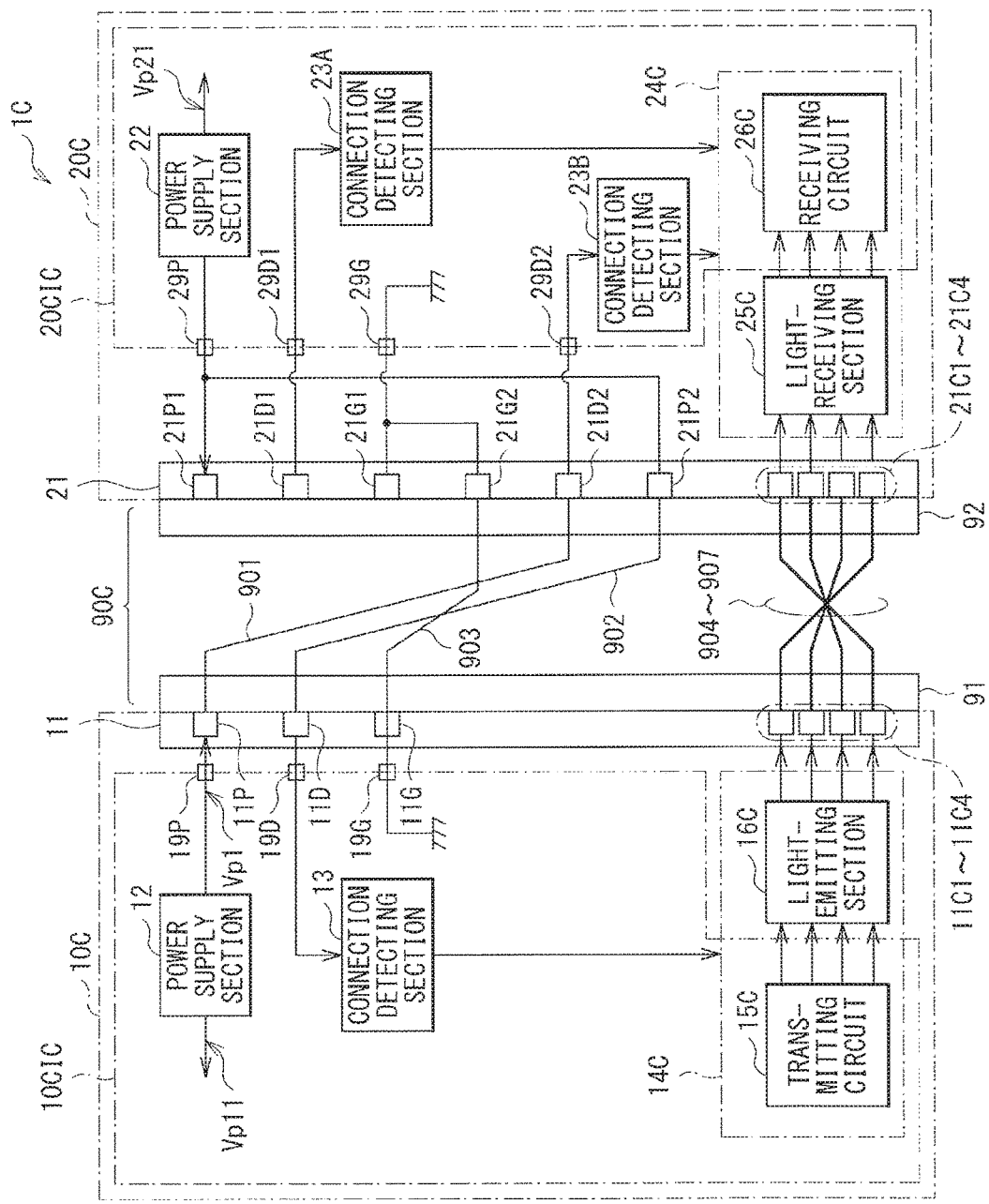
[FIG. 14B]

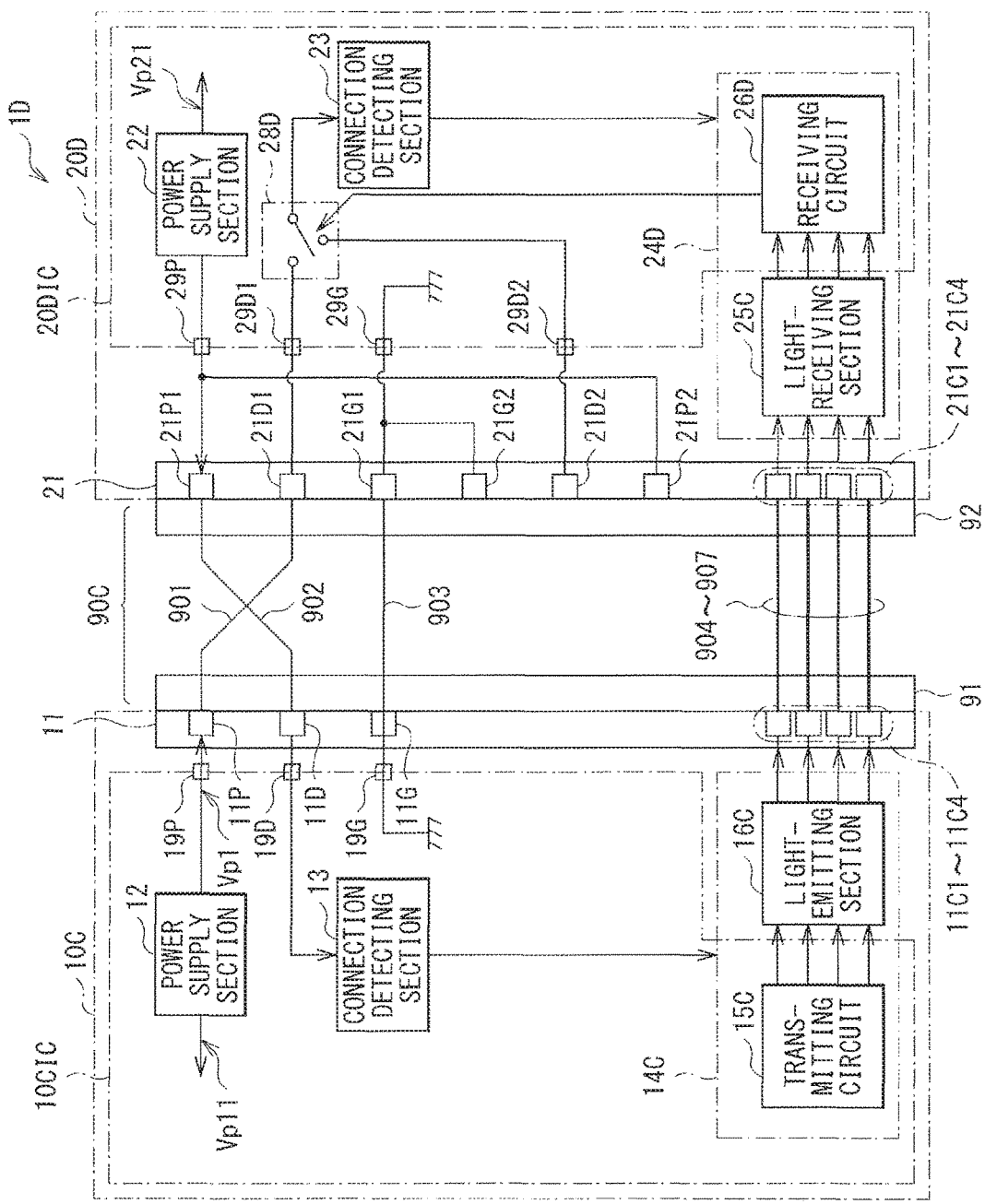
[ FIG. 15 ]

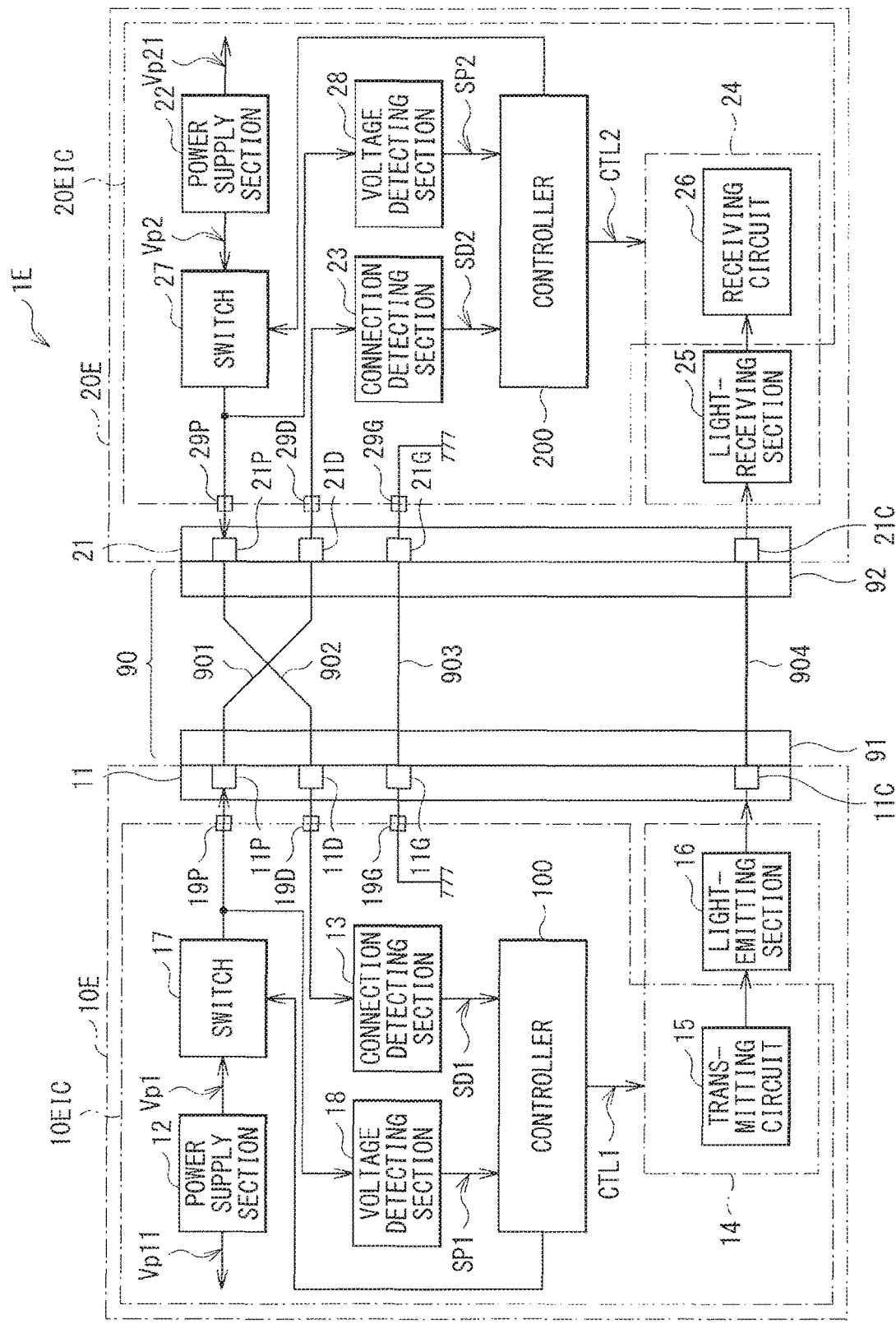
[FIG. 16]

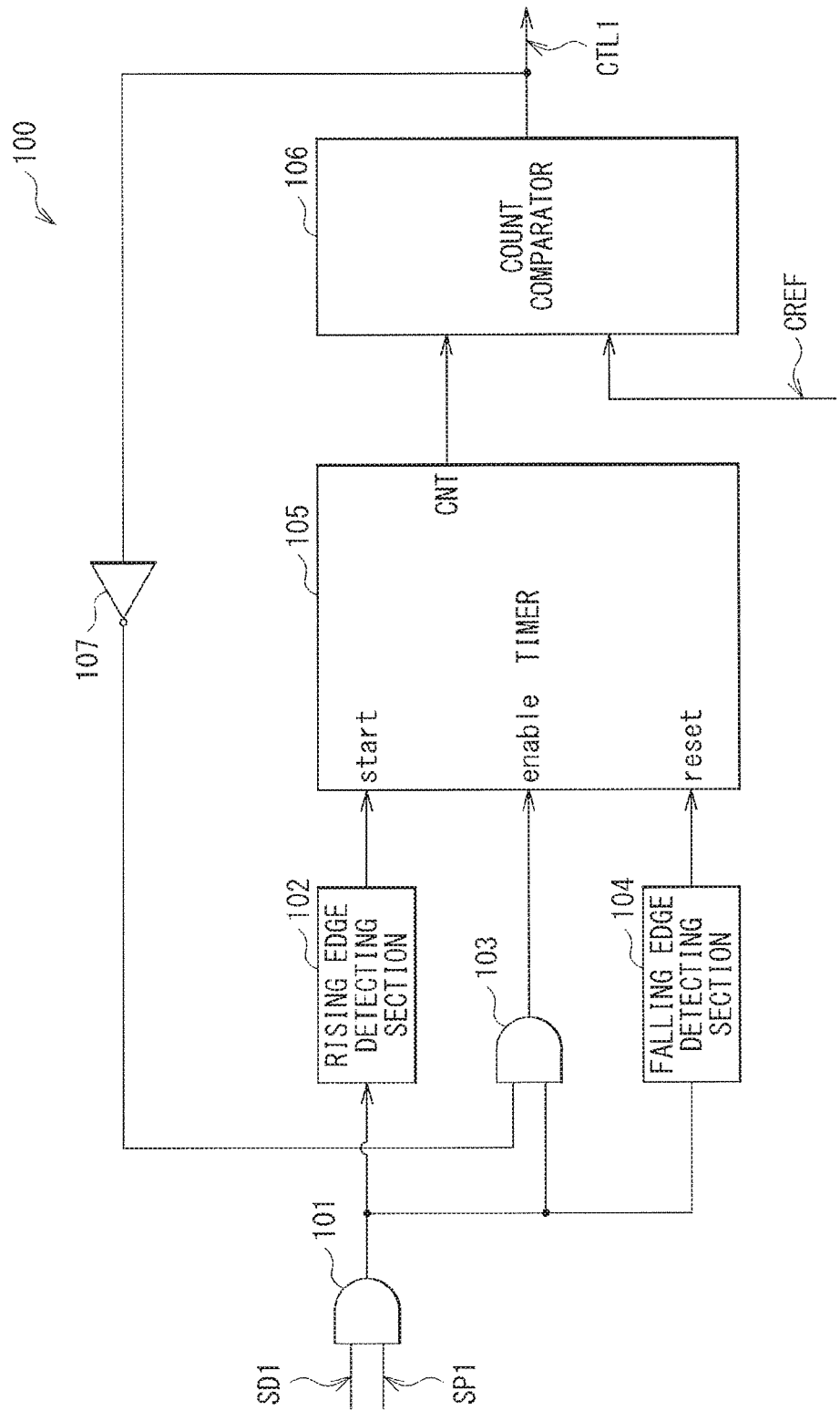
[FIG. 17]

[ FIG. 18 ]
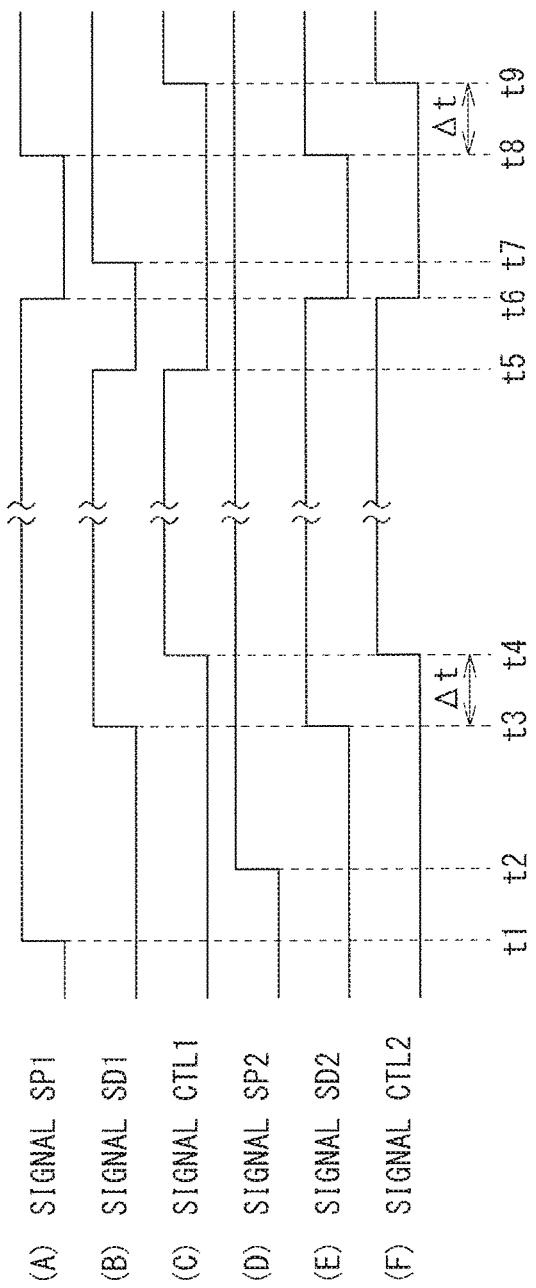

COMMUNICATION DEVICE AND COMMUNICATION SYSTEM

TECHNICAL FIELD

The disclosure relates to a communication device that performs data transmission/reception, and to a communication system that includes such a communication device.

BACKGROUND ART in association with highly-functional and multifunctional capabilities achieved in an electronic apparatus in recent years, the electronic apparatus has exchanged larger amounts of information with other electronic apparatuses. For example, the electronic apparatus is often coupled to other electronic apparatuses through wire communication. In the wire communication, optical communication is often used in exchanging the larger amounts of data.

An example of a transmitter that performs such optical communication may include a transmitter in which a light-emitting element thereof outputs an optical signal after coupling between the transmitter and an optical fiber is detected (for example, see PTL 1). This allows the transmitter to reduce the risk that the optical signal may enter a user's eye, thereby improving the safety.

CITATION LIST

Patent Literature

[PTL 1] Japanese Unexamined Patent Application Publication No. H04-155874

SUMMARY OF THE INVENTION

As seen from the above, in a communication system, increased safety been desired, and further improved safety has been expected.

It is therefore desirable to provide a communication device and a communication system that allow for improvement of the safety.

A communication device according to an embodiment of the disclosure includes a first terminal, a second terminal, a communication section, and a communication controller. The first terminal outputs a power supply voltage. The second terminal is coupled directly or indirectly to the first terminal. The communication section operates on the basis of the power supply voltage to communicate with a communication peer. The communication controller sets the communication section to be in an ON state or in an OFF state on the basis of a voltage on the second terminal.

A first communication system according to an embodiment of the disclosure includes a first communication device and a second communication device. The second communication device communicates with the first communication device. The first communication device includes a first terminal, a second terminal, a first communication section, and a first communication controller. The first terminal outputs a first power supply voltage. The second terminal is coupled directly or indirectly to the first terminal. The first communication section operates on the basis of the first power supply voltage. The first communication controller sets the first communication section to be in an ON state or in an OFF state on the basis of a voltage on the second terminal.

A second communication system according to an embodiment of the disclosure includes a first communication device and a second communication device. The second communication device communicates with the first communication device. The first communication device includes a first power supply section, a first terminal, a second terminal, a first communication section, and a first communication controller. The first power supply section generates a first voltage. The first terminal generates the first voltage. The first communication controller sets the first communication section to be in an ON state or in an OFF state on the basis of a voltage on the second terminal. The second communication device includes a second power supply section, a third terminal, a fourth terminal, a second communication section, and a second communication controller. The second power supply section generates a second voltage. The third terminal is coupled to the second terminal of the first communication device, and outputs the second voltage. The fourth terminal is coupled to the first terminal of the first communication device. The second communication section communicates with the first communication section. The second communication controller sets the second communication section to be in an ON state or in an OFF state on the basis of a voltage on the fourth terminal.

In the communication device and the first communication device according to the respective embodiments of the disclosure, the power supply voltage is outputted through the first terminal, and the communication section is set to be in the ON state or in the OFF state on the basis of the voltage on the second terminal. The first terminal and the second terminal are coupled to each other directly or indirectly.

According to the second communication device in the embodiment of the disclosure, in the first communication device, the first voltage that is generated by the first power supply section is outputted through the first terminal, and the first communication section is set to be in the ON state or in the OFF state on the basis of the voltage on the second terminal. Further, in the second communication device, the second voltage that is generated by the second power supply section is outputted through the third terminal, and the second communication section is set to be in the ON state or in the OFF state on the basis of the voltage on the fourth terminal. The first terminal and the fourth terminal are coupled to each other, and the second terminal and the third terminal are coupled to each other.

According to the communication device and the first communication system in the respective embodiments of the disclosure, there are provided the first terminal and the second terminal that are coupled to each other directly or indirectly; the power supply voltage is outputted through the first terminal; and the communication section is set to be in the ON state or in the OFF state on the basis of the voltage on the second terminal, thus making it possible to improve the safety.

According to the second communication system in the embodiment of the disclosure; the first communication device is provided with the first communication controller; the second communication controller is provided with the second communication controller; the first terminal in the first communication device is coupled to the fourth terminal in the second communication device; and the second terminal in the first communication device is coupled to the third terminal in the second communication device, thus making it possible to improve the safety.

It is to be noted that effects described herein are mere examples and are not limited thereto, and may include other effects.

BRIEF DESCRIPTION OF DRAWINGS

FIG. 1 is a block diagram illustrating a configuration example of a communication system according to a first embodiment of the disclosure.

FIG. 2 is a block diagram illustrating a configuration example of a communication system according to a second embodiment.

FIG. 3 is a block diagram illustrating a configuration example of a communication system according to a modification example of the second embodiment.

FIG. 4 is a block diagram illustrating a configuration example of a communication system according to a third embodiment.

FIG. 5A is an explanatory diagram illustrating an operation example in the communication system illustrated in FIG. 4.

FIG. 5B is an explanatory diagram illustrating another operation example in the communication system illustrated in FIG. 4.

FIG. 6 is a block diagram illustrating a configuration example of a communication system according to a modification example of the third embodiment.

FIG. 7 is a block diagram illustrating a configuration example of a communication system according to a fourth embodiment.

FIG. 8A is an explanatory diagram illustrating an operation example in the communication system illustrated in FIG. 7.

FIG. 8B is an explanatory diagram illustrating another operation example in the communication system illustrated in FIG. 7.

FIG. 9 is a block diagram illustrating a configuration example of a communication system according to a modification example of the fourth embodiment.

FIG. 10 is a block diagram illustrating a configuration example of a communication system according to a fifth embodiment.

FIG. 11A is an explanatory diagram illustrating an operation example in the communication system illustrated in FIG. 10.

FIG. 11B is an explanatory diagram illustrating another operation example in the communication system illustrated in FIG. 10.

FIG. 11C is an explanatory diagram illustrating another operation example in the communication system illustrated in FIG. 10.

FIG. 11D is an explanatory diagram illustrating another operation example in the communication system illustrated in FIG. 10.

FIG. 12 is a block diagram illustrating a configuration example of a communication system according to a modification example.

FIG. 13 is a block diagram illustrating a configuration example of a communication system according to another modification example.

FIG. 14A is a block diagram illustrating a configuration example of a communication system according to another modification example.

FIG. 14B is a block diagram illustrating another configuration example of a communication system according to another modification example.

FIG. 15 is a block diagram illustrating a configuration example of a communication system according to another modification example.

FIG. 16 is a block diagram illustrating a configuration example of a communication system according to another modification example.

FIG. 17 is a block diagram illustrating a configuration example of a controller illustrated in FIG. 16.

FIG. 18 is a timing waveform chart illustrating an operation example of the controller illustrated in FIG. 16.

DESCRIPTION OF EMBODIMENTS

Hereinafter, some embodiments of the disclosure are described in detail with reference to the drawings. It is to be noted that description is given in the following order.
1. First Embodiment
2. Second Embodiment
3. Third Embodiment
4. Fourth Embodiment
5. Fifth Embodiment

1. First Embodiment

Configuration Example

FIG. 1 illustrates a configuration example of a communication system (a communication system 1) according to a first embodiment of the disclosure. The communication system 1 is a communication system that transmits data through optical communication. The communication system 1 includes a cable 90, a transmitter 10, and a receiver 20.

The cable 90 has electric wires 901 to 903, an optical fiber 904, and connectors 91 and 92. The electric wire 901 serves to deliver a power supply voltage Vp1 (to be hereinafter described) from the transmitter 10 to the receiver 20, and a first end thereof is coupled to a terminal 11P of the transmitter 10, while a second end thereof is coupled to a terminal 21D of the receiver 20. The electric wire 902 serves to deliver a power supply voltage Vp2 (to be hereinafter described) from the receiver 20 to the transmitter 10, and a first end thereof is coupled to a terminal 21P of the receiver 20, while a second end thereof is coupled to a terminal 11D of the transmitter 10. The electric wire 903 serves to deliver a ground voltage, and a first end thereof is coupled to a terminal 11G of the transmitter 10, while a second end thereof is coupled to a terminal 21G of the receiver 20. The optical fiber 904 serves to deliver an optical signal from the transmitter 10 to the receiver 20, and a first end thereof is coupled to a terminal 11C of the transmitter 10, while a second end thereof is coupled to a terminal 21C of the receiver 20. The connector 91 is provided on a first end of the cable 90, and is configured to be coupled to a connector 11 of the transmitter 10. The connector 92 is provided on a second end of the cable 90, and is configured to be coupled to a connector 21 of the receiver 20.

The transmitter 10 transmits data to the receiver 20. The transmitter 10 includes the connector 11, a power supply section 12, a connection detecting section 13, and a transmitting section 14.

The connector 11 is configured to be coupled to the connector 91 of the cable 90. The connector 11 has terminals 11P, 11D, 11G, and 11C. The terminals 11P, 11D, and 11G are terminals for electric signals, and the terminal 11C is a terminal for an optical signal. The terminal 11P is coupled to the electric wire 901; the terminal 11D is coupled to the electric wire 902; and the terminal 11G is coupled to the electric wire 903. Further, the terminal 11C is coupled to the optical fiber 904.

The power supply section 12 generates DC power supply voltages Vp1 and Vp11 on the basis of an AC power supply voltage to be supplied from the outside, for example. Thereafter, the power supply section 12 supplies the power supply voltage Vp1 to the receiver 20 through the terminal 11P and the electric wire 901, and supplies the power supply voltage Vp11 to each block inside the transmitter 10.

The connection detecting section 13 detects, on the basis of a voltage on the terminal 11D, that the receiver 20 has been coupled to the transmitter 10 through the cable 90. Thereafter, the connection detecting section 13 controls a transmitting operation in the transmitting section 14 on the basis of a result of the detection. Specifically, the connection detecting section 13 sets the transmitting section 14 to be in an ON state in a case where the transmitter 10 and the receiver 20 are coupled to each other, and sets the transmitting section 14 to be in an OFF state in a case where the transmitter 10 and the receiver 20 are not coupled to each other.

The transmitting section 14 transmits an optical signal to the receiver 20. The transmitting section 14 has a transmitting circuit 15 and a light-emitting section 16. The transmitting circuit 15 generates data to be transmitted. The light-emitting section 16 converts an electric signal into an optical signal, and may include, for example, a laser diode, a drive circuit that drives the laser diode, or any other relevant circuit. The transmitting section 14 is set to be in the ON state or in the OFF state on the basis of an instruction from the connection detecting section 13.

The power supply section 12, the connection detecting section 13, and the transmitting circuit 15 are integrated on a semiconductor chip 10IC in this example. The semiconductor chip 10IC includes terminals 19P, 19D, and 19G. The terminal 19P is coupled to the terminal 11P of the connector 11; the terminal 19D is coupled to the terminal 11D of the connector 11; and the terminal 19G is coupled to the terminal 11G of the connector 11.

The receiver 20 receives data transmitted from the transmitter 10. The receiver 20 includes a connector 21, a power supply section 22, a connection detecting section 23, and a receiving section 24.

The connector 21 is configured to be coupled to the connector 92 of the cable 90. The connector 21 includes terminals 21P, 21D, 21G, and 21C. The terminals 21P, 21D, and 21G are terminals for electric signals, and the terminal 21C is a terminal for an optical signal. The terminal 21P is coupled to the electric wire 902; the terminal 21D is coupled to the electric wire 901; and the terminal 21G is coupled to the electric wire 903. Further, the terminal 21C is coupled to the optical fiber 904.

As with the power supply section 12 of the transmitter 10, the power supply section 22 generates DC power supply voltages Vp2 and Vp21 on the basis of an AC power supply voltage to be supplied from the outside, for example. Thereafter, the power supply section 22 supplies the power supply voltage Vp2 to the transmitter 10 through the terminal 21P and the electric wire 902, and supplies the power supply voltage Vp21 to each block inside the receiver 20.

As with the connection detecting section 13 of the transmitter 10, the connection detecting section 23 detects, on the basis of a voltage on the terminal 21D, that the transmitter 10 has been coupled to the receiver 20 through the cable 90. Thereafter, the connection detecting section 23 controls a receiving operation in the receiving section 24 on the basis of a result of the detection. Specifically, the connection detecting section 23 sets the receiving section 24 to be in an ON state in a case where the transmitter 10 and the receiver 20 are coupled to each other, and sets the receiving section 24 to be in an OFF state in a case where the transmitter 10 and the receiver 20 are not coupled to each other.

The receiving section 24 receives an optical signal transmitted from the transmitting section 14 of the transmitter 10. The receiving section 24 includes a light-receiving section 25 and a receiving circuit 26. The light-receiving section 25 converts an optical signal into an electric signal, and may include, for example, a photodetector, an amplifier circuit that amplifies an electric signal to be provided as an output from the photodetector, or any other relevant circuit. The receiving circuit 26 receives an electric signal from the light-receiving section 25. The receiving section 24 is set in the ON state or in the OFF state on the basis of an instruction from the connection detecting section 23.

The power supply section 22, the connection detecting section 23, and the receiving circuit 26 are integrated on a semiconductor chip 20IC in this example. The semiconductor chip 20IC includes terminals 29P, 29D, and 29G. The terminal 29P is coupled to the terminal 21P of the connector 21; the terminal 29D is coupled to the terminal 21D of the connector 21; and the terminal 29G is coupled to the terminal 21G of the connector 21.

Here, the semiconductor chip 10IC corresponds to a specific example of the "first communication device" in the second communication system of the disclosure. The semiconductor chip 20IC corresponds to a specific example of the "second communication device" in the disclosure. The power supply section 12 corresponds to a specific example of the "first power supply section" in the disclosure. The power supply section 22 corresponds to a specific example of the "second power supply section" in the disclosure. The terminal 19P corresponds to a specific example of the "first terminal" in the disclosure, and the terminal 19D corresponds to a specific example of the "second terminal" in the disclosure. The terminal 29P corresponds to a specific example of the "third terminal" in the disclosure, and the terminal 29G corresponds to a specific example of the "fourth terminal" in the disclosure. The transmitting circuit 15 corresponds to a specific example of the "first communication section" in the disclosure. The receiving circuit 26 corresponds to a specific example of the "second communication section" in the disclosure. The connection detecting section 13 corresponds to a specific example of the "first communication controller" in the disclosure. The connection detecting section 23 corresponds to a specific example of the "second communication controller" in the disclosure.

[Operation and Workings]

Next, description is provided on an operation and workings of the communication system 1 of the present embodiment.

(Overview of Overall Operation)

First, with reference to FIG. 1, description is provided on an overview of the overall operation of the communication system 1. The connection detecting section 13 of the transmitter 10 detects, on the basis of a voltage on the terminal 11D, that the receiver 20 has been coupled to the transmitter 10 through the cable 90. The connection detecting section 23 of the receiver 20 detects, on the basis of a voltage on the terminal 21D, that the transmitter 10 has been coupled to the receiver 20 through the cable 90. The transmitting section 14 of the transmitter 10 transmits an optical signal to the receiving section 24 of the receiver 20, and the receiving section 24 of the receiver 20 receives the optical signal transmitted from the transmitting section 14 of the transmitter 10.

(Detailed Operation)

Next, description is provided on detailed operation of the communication system 1.

In the transmitter 10, the power supply section 12 generates the DC power supply voltages Vp1 and Vp11. The power supply voltage Vp1 is supplied to the terminal 11P. Further, the power supply voltage Vp11 is supplied to each block inside the transmitter 10. This causes each block inside the transmitter 10 to be in an operable state.

In the same manner, in the receiver 20, the power supply section 22 generates the DC power supply voltages Vp2 and Vp21. The power supply voltage Vp2 is supplied to the terminal 21P. Further, the power supply voltage Vp21 is supplied to each block inside the receiver 20. This causes each block inside the receiver 20 to be in an operable state.

When the transmitter 10 and the receiver 20 are coupled to each other through the cable 90, the power supply voltage Vp2 that is generated by the power supply section 22 of the receiver 20 is supplied to the connection detecting section 13 of the transmitter 10 through the terminal 21P, the electric wire 902, and the terminal 11D. By detecting the power supply voltage Vp2, the connection detecting section 13 determines that the receiver 20 has been coupled to the transmitter 10 through the cable 90. Thereafter, the connection detecting section 13 sets the transmitting section 14 to be in the ON state. This enables the transmitter 10 to transmit the optical signal.

At the same time, the power supply voltage Vp1 that is generated by the power supply section 12 of the transmitter 10 is supplied to the connection detecting section 23 of the receiver 20 through the terminal 11P, the electric wire 901, and the terminal 21D. By detecting the power supply voltage Vp1, the connection detecting section 23 determines that the transmitter 10 has been coupled to the receiver 20 through the cable 90. Thereafter, the connection detecting section 23 sets the receiving section 24 to be in the ON state. This enables the receiver 20 to receive the optical signal.

In such a manner, it becomes possible for the transmitter 10 and the receiver 20 to perform optical communication. Thereafter, the transmitting section 14 of the transmitter 10 transmits data, and the receiving section 24 of the receiver 20 receives the data through the optical fiber 904.

As described above, in the communication system 1, the connection detecting section 13 of the transmitter 10 sets the transmitting section 14 to be in the ON state on the basis of the power supply voltage Vp2 that is supplied from the receiver 20, thus making it possible to reduce a risk that an optical signal may enter a user's eye. That is, for example, as seen in the technology mentioned in PTL 1, in a case where it is detected that a cable has been coupled and a transmitting section is turned into an ON state on the basis of a result of the detection, the transmitter results in transmitting an optical signal even when a receiver is not coupled to a cable end. In such a case, there is the risk that the optical signal may enter a user's eye. In particular, in performing the optical communication using invisible light, the user is unable to directly perceive with visual inspection whether the transmitter is transmitting the optical signal. As a result, there is a risk that the optical signal may enter a user's eye without noticing, thus damaging the user's eye. In contrast, in the communication system 1, the connection detecting section 13 turn the transmitting section 14 into the ON state on the basis of the power supply voltage Vp2 that is supplied from the receiver 20. Consequently, for example, even when the cable 90 is coupled to the transmitter 10, the power supply voltage Vp2 is not supplied to the connection detecting section 13 when the receiver 20 is not coupled to an end of the cable 90. Accordingly, the connection detecting section 13 keeps the transmitting section 14 in the OFF state, and therefore the optical signal is not transmitted. As a result, it is possible to reduce the risk that the optical signal may enter a user's eye, thus improving the safety.

Further, in the communication system 1, the connection detecting section 23 of the receiver 20 sets the receiving section 24 to be in the ON state on the basis of the power supply voltage Vp1 that is supplied from the transmitter 10. This enables the receiving section 24 to be in the OFF state, for example, in a case where the transmitter 10 and the receiver 20 are not coupled to each other, thus allowing for reduction in power consumption, for example.

Effects

As described above, in the present embodiment, the connection detecting section of the transmitter sets the transmitting section to be in the ON state on the basis of the power supply voltage that is supplied from the receiver, thus making it possible to reduce the risk that the optical signal may enter a user's eye, which improves the safety.

2. Second Embodiment

Next, description is provided on a communication system 2 according to a second embodiment. The present embodiment differs in a configuration of the transmitter from the above-described first embodiment. In other words, in the above-described first embodiment (FIG. 1), the transmitter 10 having the power supply section 12 is used. As an alternative, however, in the present embodiment, a transmitter is used that includes no power supply section 12, and operates by receiving power from a communication peer. It is to be noted that constituent elements substantially the same as those in the communication system 1 according to the above-described first embodiment are denoted with the same reference numerals, and the related descriptions are omitted as appropriate.

FIG. 2 illustrates a configuration example of the communication system 2. The communication system 2 includes a transmitter 30. The transmitter 30 transmits data to the receiver 20. The transmitter 30 includes the connector 11, the connection detecting section 13, and the transmitting section 14. In other words, unlike the transmitter 10 according to the above-described first embodiment (FIG. 1), the transmitter 30 includes no power supply section 12. Further, in the transmitter 30, the terminal 11P and the terminal 11D are coupled to each other. With such a configuration, the receiver 20 functions also as a power feeder that supplies power (the power supply voltage Vp2) to the transmitter 30. The transmitter 30 operates on the basis of power that is supplied from the receiver 20. The connection detecting section 13 and the transmitting circuit 15 are integrated on a semiconductor chip 30IC in this example.

Here, the semiconductor chip 30IC corresponds to a specific example of the "communication device" in the disclosure. The terminal 19P corresponds to a specific example of the "first terminal" in the disclosure, and the terminal 19D corresponds to a specific example of the "second terminal" in the disclosure. The transmitting circuit 15 corresponds to a specific example of the "communication section" in the disclosure. The connection detecting section 13 corresponds to a specific example of the "communication controller" in the disclosure.

Next, description is provided on an operation in the communication system 2.

In the receiver 20, the power supply section 22 generates the DC power supply voltages Vp2 and Vp21. The power supply voltage Vp2 is supplied to the terminal 21P. Further, the power supply voltage Vp21 is supplied to each block inside the receiver 20. This causes each block inside the receiver 20 to be in an operable state.

When the transmitter 30 and the receiver 20 are coupled to each other through the cable 90, the power supply voltage Vp2 that is generated by the power supply section 22 of the receiver 20 is supplied to the connection detecting section 13 of the transmitter 30 as well as to each block inside the transmitter 30 through the terminal 21P, the electric wire 902, and the terminal 11D. This causes each block inside the transmitter 30 to be in an operable state. It is to be noted that, in supplying the power supply voltage Vp2 to each block inside the transmitter 30, a voltage may be converted using, for example, a regulator, and the converted voltage may be supplied. Further, by detecting the power supply voltage Vp2, the connection detecting section 13 determines that the receiver 20 has been coupled to the transmitter 30 through the cable 90. Thereafter, the connection detecting section 13 sets the transmitting section 14 to be in an ON state. This enables the transmitter 30 to transmit the optical signal.

The power supply voltage Vp2 that is supplied to the transmitter 30 in such a manner is further supplied to the connection detecting section 23 of the receiver 20 through the terminal 11P, the electric wire 901, and the terminal 21D. In other words, the power supply voltage Vp2 that is outputted from the receiver 20 is inputted into the receiver 20 again through the transmitter 30. By detecting the power supply voltage Vp2, the connection detecting section 23 determines that the transmitter 30 has been coupled to the receiver 20 through the cable 90. Thereafter, the connection detecting section 23 sets the receiving section 24 to be in an ON state. This enables the receiver 20 to receive the optical signal.

As described above, in the communication system 2, the terminal 11P and the terminal 11D of the transmitter 30 are coupled to each other, and each block operates on the basis of the power supply voltage Vp2 that is received through the terminal HD. Therefore, a simple configuration enables the receiver 20 to supply power to the transmitter 30. That is, for example, as seen in a USB (registered trademark) 3.1, in a case where it is determined which party should supply power by performing communication with a communication peer beforehand, there is a possibility that a configuration may be complicated. In contrast, in the communication system 2, because the terminal 11P and the terminal 11D are coupled to each other in the transmitter 30, the receiver 20 supplies power to the transmitter 30 without performing any special processing, thus enabling the transmitter 30 to receive the power from the receiver 20. As a result, this allows the communication system 2 to achieve a simple configuration.

Further, in the transmitter 30, the power supply voltage Vp2 that is received through the terminal 11D is outputted through the terminal 11P, which enables the receiver 20 to detect that a communication peer (the transmitter 30) has been coupled to the receiver 20 even in a case where the communication peer is not provided with a power supply section as seen in the power supply section 12 of the transmitter 10 (FIG. 1). In other words, it is possible for the receiver 20 to perform a similar operation even in a case where the communication peer is the transmitter 30 (FIG. 2) or the transmitter 10 (FIG. 1) according to the first embodiment. In such a manner, it is possible for the receiver 20 to couple to both of the transmitters 10 and 30, thus allowing for an increase in a degree of freedom of the system.

Moreover, the transmitter 30 operates on the basis of the power (the power supply voltage Vp2) that is supplied from the receiver 20, thus enabling the transmitter 30 to be mounted on various electronic apparatuses including an electronic apparatus that has no power supply or battery.

As described above, in the present embodiment, the terminal 11P and the terminal 11D of the transmitter are coupled to each other, and each block operates on the basis of the power supply voltage Vp2 that is received through the terminal 11D. Therefore, the simple configuration enables the receiver makes to supply power to the transmitter.

In the present embodiment, the power supply voltage Vp2 that is received through the terminal 11D is outputted through the terminal 11P, thus enabling the receiver to detect that the transmitter has been coupled to the receiver even in a case where the transmitter is not provided with a power supply section.

Other effects are similar to those in the case of the above-described first embodiment.

Modification Example 2-1

In the above-described embodiment, the communication system 2 is configured by the transmitter 30 having no power supply section and the receiver 20 having the power supply section; however, the configuration is not limited thereto. As an alternative, for example, as seen in a communication system 2B illustrated in FIG. 3, the communication system 2B may be configured by the transmitter 10 having a power supply section and a receiver 40 having no power supply section. The receiver 40 includes the connector 21, the connection detecting section 23, and the receiving section 24. In other words, unlike the receiver 20 according to the above-described embodiments, the receiver 40 includes no power supply section 22. Further, in the receiver 40, the terminal 11P and the terminal 11D are coupled to each other. The connection detecting section 23 and the receiving circuit 26 are integrated on a semiconductor chip 40IC in this example.

Here, the semiconductor chip 40IC corresponds to a specific example of the "communication device" in the disclosure. The terminal 29P corresponds to a specific example of the "first terminal" in the disclosure, and the terminal 29D corresponds to a specific example of the "second terminal" in the disclosure. The receiving circuit 26 corresponds to a specific example of the "communication section" in the disclosure. The connection detecting section 23 corresponds to a specific example of the "communication controller" in the disclosure.

When the transmitter 10 and the receiver 40 are coupled to each other through the cable 90, the power supply voltage Vp1 that is generated by the power supply section 12 of the transmitter 10 is supplied to the connection detecting section 23 of the receiver 40 as well as to each block inside the receiver 40 through the terminal 11P, the electric wire 901, and the terminal 21D. This enables the receiver 40 to receive the optical signal. The power supply voltage Vp1 that is supplied to the receiver 40 in such a manner is further supplied to the connection detecting section 13 of the transmitter 10 through the terminal 21P, the electric wire 902, and the terminal 11D. This enables the transmitter 10 to transmit the optical signal.

3. Third Embodiment

Next, description is provided on a communication system 3 according to a third embodiment. The present embodiment differs in a configuration of the transmitter from the above-described first embodiment. That is, in the above-described first embodiment (FIG. 1), the transmitter 10 having the power supply section 12 is used. As an alternative, however, in the present embodiment, a transmitter having a battery is used. It is to be noted that constituent elements substantially the same as those in the communication system 1 according to the above-described first embodiment are denoted with the same reference numerals, and the related descriptions are omitted as appropriate.

FIG. 4 illustrates a configuration example of the communication system 3. The communication system 3 includes a transmitter 50. The transmitter 50 transmits data to the receiver 20. The transmitter 50 includes a battery 51, a voltage detecting section 52, and a switch 53. The battery 51 stores power. The voltage detecting section 52 detects an output voltage from the battery 51 to control the switch 53 on the basis of a result of the detection. Specifically, in a case where the output voltage from the battery 51 is higher than a predetermined voltage, the voltage detecting section 52 turn the switch 53 into an OFF state. In other cases, the voltage detecting section 52 turn the switch 53 into an ON state. The switch 53 is inserted between the terminal 11P and the terminal 11D, and is turned on and off on the basis of an instruction from the voltage detecting section 52. Such a configuration allows the transmitter 50 to operate on the basis of power (the power supply voltage Vp2) that is supplied from the receiver 20, in a case where the battery 51 is not fully charged. The voltage detecting section 52, the switch 53, the connection detecting section 13, and the transmitting circuit 15 are integrated on a semiconductor chip 50IC in this example.

Here, the semiconductor chip 50IC corresponds to a specific example of the "communication device" in the disclosure. The terminal 19P corresponds to a specific example of the "first terminal" in the disclosure, and the terminal 19D corresponds to a specific example of the "second terminal" in the disclosure. The transmitting circuit 15 corresponds to a specific example of the "communication section" in the disclosure. The connection detecting section 13 corresponds to a specific example of the "communication controller" in the disclosure. The voltage detecting section 52 corresponds to a specific example of the "switch controller" in the disclosure.

Next, description is provided on an operation in the communication system 3 by citing as examples a case where the battery 51 is fully charged (case C1) and a case where the battery 51 is not fully charged (case C2).

(Case C1)

FIG. 5A illustrates an operation example of the communication system 3 in the case where the battery 51 is fully charged (case C1).

In the case C1, the battery 51 is fully charged, and an output voltage (a power supply voltage Vp5) of the battery 51 is higher than a predetermined voltage. Therefore, the voltage detecting section 52 of the transmitter 50 turn the switch 53 into the OFF state. Further, the power supply voltage Vp5 is supplied to each block inside the transmitter 50. This causes each block inside the transmitter 50 to be in an operable state. It is to be noted that, in supplying the power supply voltage Vp5 to each block inside the transmitter 50, a voltage may be converted using, for example, a regulator, and the converted voltage may be supplied.

In the receiver 20, the power supply section 22 generates the DC power supply voltages Vp2 and Vp21. The power supply voltage Vp2 is supplied to the terminal 21P. Further, the power supply voltage Vp21 is supplied to each block inside the receiver 20. This causes each block inside the receiver 20 to be in an operable state.

When the transmitter 50 and the receiver 20 are coupled to each other through the cable 90, the power supply voltage Vp2 that is generated by the power supply section 22 of the receiver 20 is supplied to the connection detecting section 13 of the transmitter 50 through the terminal 21P, the electric wire 902, and the terminal 11D. By detecting the power supply voltage Vp2, the connection detecting section 13 determines that the receiver 20 has been coupled to the transmitter 50 through the cable 90. Thereafter, the connection detecting section 13 sets the transmitting section 14 to be in an ON state. This enables the transmitter 50 to transmit the optical signal.

At the same time, the power supply voltage Vp5 that is outputted from the battery 51 of the transmitter 50 is supplied to the connection detecting section 23 of the receiver 20 through the terminal 11P, the electric wire 901, and the terminal 21D. By detecting the power supply voltage Vp5, the connection detecting section 23 determines that the transmitter 50 has been coupled to the receiver 20 through the cable 90. Thereafter, the connection detecting section 23 sets the receiving section 24 to be in an ON state. This enables the receiver 20 to receive the optical signal.

(Case C2)

FIG. 5B illustrates an operation example of the communication system 3 in the case where the battery 51 is not fully charged (case C2).

In the case C2, the battery 51 is not fully charged, and the output voltage of the battery 51 does not reach the predetermined voltage. Therefore, the voltage detecting section 52 of the transmitter 50 turns the switch 53 into an ON state.

In the receiver 20, the power supply section 22 generates the DC power supply voltages Vp2 and Vp21. The power supply voltage Vp2 is supplied to the terminal 21P. Further, the power supply voltage Vp21 is supplied to each block inside the receiver 20. This causes each block inside the receiver 20 to be in an operable state.

When the transmitter 50 and the receiver 20 are coupled to each other through the cable 90, the power supply voltage Vp2 that is generated by the power supply section 22 of the receiver 20 is supplied to the connection detecting section 13 of the transmitter 50 through the terminal 21P, the electric wire 902, and the terminal 11D, and is further supplied to the battery 51 and each block inside the transmitter 50 through the switch 53. This causes each block inside the transmitter 50 to be in an operable state, and the battery 51 is charged. It is to be noted that, in supplying the power supply voltage Vp2 to each block inside the transmitter 50, a voltage may be converted using, for example, a regulator, and the converted voltage may be supplied. Further, by detecting the power supply voltage Vp2, the connection detecting section 13 determines that the receiver 20 has been coupled to the transmitter 50 through the cable 90. Thereafter, the connection detecting section 13 sets the transmitting section 14 to be in an ON state. This enables the transmitter 50 to transmit the optical signal.

The power supply voltage Vp2 that is supplied to the transmitter 50 in such a manner is further supplied to the connection detecting section 23 of the receiver 20 through the terminal 11P, the electric wire 901, and the terminal 21D. By detecting the power supply voltage Vp2, the connection detecting section 23 determines that the transmitter 50 has been coupled to the receiver 20 through the cable 90. Thereafter, the connection detecting section 23 sets the receiving section 24 to be in an ON state. This enables the receiver 20 to receive the optical signal.

As described above, in the transmitter 50, the switch 53 is provided between the terminal 11P and the terminal 11D, and the switch 53 is turned on and off depending on a charging level in the battery 51. This allows the communication system 3 to operate in a similar manner to the communication system 1 according to the first embodiment (FIG. 1), in the case where the battery 51 is fully charged (case C1). In other words, in the case C1, the transmitter 50 operates on the basis of the power that is supplied from the battery 51 of the transmitter 50, and the receiver 20 operates on the basis of the power that is supplied by the power supply section 22 of the receiver 20. In contrast, in the case where the battery 51 is not fully charged (case C2), the communication system 3 operates in a similar manner to the communication system 2 according to the second embodiment (FIG. 2). In other words, in the case C2, the receiver 20 functions also as a power feeder. It is possible for the receiver 20 to supply the power supply voltage Vp2 to each block inside the transmitter 50, and to charge the battery 51 of the transmitter 50.

As described above, in the present embodiment, the switch is provided between the terminal 11P and the terminal 11D of the transmitter, and the switch is turned on and off depending on a charging level in the battery. Therefore, in the case where the battery is not fully charged, it is possible for the receiver to supply the power to the transmitter. Other effects are similar to those in the cases of the above-described first and second embodiments.

Modification Example 3-1

In the above-described embodiment, the communication system 3 is configured by the transmitter 50 having the battery 51 and the receiver 20 having the power supply section 22; however, the configuration is not limited thereto. As an alternative, for example, as seen in a communication system 3B illustrated in FIG. 6, a communication system may be configured by the transmitter 10 having the power supply section 12 and a receiver 60 having a battery 61. The receiver 60 includes the battery 61, a voltage detecting section 62, and a switch 63. The battery 61 stores power. The voltage detecting section 62 detects an output voltage from the battery 61 to control the switch 63 on the basis of a result of the detection. The switch 63 is inserted between the terminal 21P and the terminal 21D, and is turned on and off on the basis of an instruction from the voltage detecting section 62. The voltage detecting section 62, the switch 63, the connection detecting section 23, and the receiving circuit 26 are integrated on a semiconductor chip 60IC in this example.

Here, the semiconductor chip 60IC corresponds to a specific example of the "communication device" in the disclosure. The terminal 29P corresponds to a specific example of the "first terminal" in the disclosure, and the terminal 21P corresponds to a specific example of the "second terminal" in the disclosure. The receiving circuit 26 corresponds to a specific example of the "communication section" in the disclosure. The connection detecting section 23 corresponds to a specific example of the "communication controller" in the disclosure. The voltage detecting section 62 corresponds to a specific example of the "switch controller" in the disclosure.

In a case where the battery 61 is fully charged, the voltage detecting section 62 turn the switch 63 into an OFF state, as with the case of the above-described embodiment. This allows the communication system 3B to operate in a similar manner to the communication system 1 according to the above-described first embodiment (FIG. 1). Further, in a case where the battery 61 is not fully charged, the voltage detecting section 62 turns the switch 63 into an ON state, as with the case of the above-described embodiment. This allows the communication system 3B to operate in a similar manner to the communication system 2B according to the modification example of the second embodiment (FIG. 3). In other words, in such a case, the transmitter 10 functions also as a power feeder. It is possible for the transmitter 10 to supply the power supply voltage Vp1 to each block inside the receiver 60, and to charge the battery 61 of the receiver 60.

4. Fourth Embodiment

Next, description is provided on a communication system 4 according to a fourth embodiment. The present embodiment differs in a configuration of the communication system from the above-described third embodiment. In other words, in the above-described third embodiment (FIG. 4), the communication system 3 is configured by the transmitter 50 having the battery 51 and the receiver 20 having the power supply section 22. As an alternative, however, in the present embodiment, the communication system 4 is configured by a transmitter having no power supply section and a receiver having a battery. It is to be noted that constituent elements substantially the same as those in the communication systems 1 to 3 according respectively to the above-described first to third embodiments are denoted with the same reference numerals, and the related descriptions are omitted as appropriate.

FIG. 7 illustrates a configuration example of the communication system 4. The communication system 4 includes the transmitter 30 and the receiver 60. The transmitter 30 transmits data to the receiver 60, and includes no power supply section as described in the second embodiment (FIG. 2). The receiver 60 receives the data transmitted from the transmitter 30, and includes the battery 61 as described in the modification example of the third embodiment (FIG. 6).

Next, description is provided on an operation in the communication system 4 by citing as examples a case where the battery 61 is fully charged (case C3) and a case where the battery 61 is not fully charged (case C4).
(Case C3)

FIG. 8A illustrates an operation example of the communication system 4 in the case where the battery 61 is fully charged (case C3).

In the case C3, the battery 61 is fully charged, and an output voltage (a power supply voltage Vp6) of the battery 61 is higher than a predetermined voltage. Therefore, the voltage detecting section 62 of the receiver 60 turn the switch 63 into an OFF state. Further, the power supply voltage Vp6 is supplied to each block inside the receiver 60. This causes each block inside the receiver 60 to be in an operable state.

When the transmitter 30 and the receiver 60 are coupled to each other through the cable 90, the power supply voltage Vp6 that is outputted by the battery 61 of the receiver 60 is supplied to the connection detecting section 13 of the transmitter 30 and to each block inside the transmitter 30 through the terminal 21P, the electric wire 902, and the terminal 11D. This causes each block inside the transmitter 30 to be in an operable state. Further, by detecting the power supply voltage Vp6, the connection detecting section 13 determines that the receiver 60 has been coupled to the transmitter 30 through the cable 90. Thereafter, the connection detecting section 13 sets the transmitting section 14 to be in an ON state. This enables the transmitter 30 to transmit the optical signal.

The power supply voltage Vp6 that is supplied to the transmitter 30 in such a manner is further supplied to the connection detecting section 23 of the receiver 60 through the terminal 11P, the electric wire 901, and the terminal 21D. By detecting the power supply voltage Vp6, the connection detecting section 23 determines that the transmitter 30 has been coupled to the receiver 60 through the cable 90. Thereafter, the connection detecting section 23 sets the receiving section 24 to be in an ON state. This enables the receiver 60 to receive the optical signal.

(Case C4)

FIG. 8B illustrates an operation example of the communication system 4 in the case where the battery 61 is not fully charged (case C4). In the case C4, the battery 61 is not fully charged, and the output voltage of the battery 61 does not reach the predetermined voltage. Therefore, the voltage detecting section 62 of the receiver 60 turn the switch 63 into an ON state.

In the case C4, the transmitter 30 includes no power supply section, and the battery 61 is not fully charged in the receiver 60. As a result, the communication system 4 performs no operation.

As described above, the communication system 4 adopts the transmitter 30 having no power supply section and the receiver 60 having the battery 61. This allows the communication system 4 to operate in a similar manner to the communication system 2 according to the second embodiment (FIG. 2), in the case where the battery 61 is fully charged (case C3). In other words, in the case C3, the receiver 60 functions also as a power feeder to supply the power supply voltage Vp6 to each block inside the transmitter 30. In contrast, in the case where the battery 61 is not fully charged (case C4), the communication system 4 performs no operation.

As described above, in the present embodiment, the communication system is configured by the transmitter having no power supply section and the receiver having the battery, thus enabling the receiver to supply the power to the transmitter in the case where the battery is fully charged. Other effects are similar to those in the cases of the above-described first to third embodiments.

Modification Example 4-1

In the above-described embodiment, the communication system 4 is configured by the transmitter 30 having no power supply section and the receiver 60 having the battery 61; however, the configuration is not limited thereto. As an alternative, for example, as seen in a communication system 4B illustrated in FIG. 9, the communication system may be configured by the transmitter 50 having the battery 51 and the receiver 40 having no power supply section.

In the case where the battery 51 is fully charged, the voltage detecting section 52 turn the switch 53 into an OFF state. This allows the communication system 4B to operate in a similar manner to the communication system 2B according to the above-described modification example of the second embodiment (FIG. 3). In other words, in such a case, the transmitter 50 functions also as a power feeder to supply the power supply voltage Vp5 to each block inside the receiver 40. Further, in the case where the battery 51 is not fully charged, the voltage detecting section 52 turns the switch 53 into an ON state. In this case, the communication system 4B performs no operation.

5. Fifth Embodiment

Next, description is provided on a communication system 5 according to a fifth embodiment. The present embodiment differs in a configuration of the communication system from the above-described third and fourth embodiments. In other words, in the above-described third and fourth embodiments (FIGS. 4 and 7), one of the transmitter and the receiver includes a battery. As an alternative, however, in the present embodiment, the transmitter and the receiver each have a battery. It is to be noted that constituent elements substantially the same as those in the communication systems 3 and 4 according respectively to the above-described third and fourth embodiments are denoted with the same reference numerals, and the related descriptions are omitted as appropriate.

FIG. 10 illustrates a configuration example of the communication system 5. The communication system 5 includes the transmitter 50 and the receiver 60. The transmitter 50 transmits data to the receiver 60, and includes the battery 51 as described in the third embodiment (FIG. 4). The receiver 60 receives the data transmitted from the transmitter 50, and includes the battery 61 as described in the modification example of the third embodiment (FIG. 6).

Next, description is provided on an operation in the communication system 5 by citing as examples a case where both of the batteries 51 and 61 are fully charged (case C5), a case where the battery 61 is fully charged, and the battery 51 is not fully charged (case C6), a case where the battery 51 is fully charged, and the battery 61 is not fully charged (case C7), and a case where both of the batteries 51 and 61 are not fully charged (case C8).

(Case C5)

FIG. 11A illustrates an operation example of the communication system 5 in the case where both of the batteries 51 and 61 are fully charged (case C5).

In the case C5, the battery 51 is fully charged, and the output voltage (the power supply voltage Vp5) of the battery 51 is higher than a predetermined voltage. Therefore, the voltage detecting section 52 of the transmitter 50 turn the switch 53 into the OFF state. Further, the power supply voltage Vp5 is supplied to each block inside the transmitter 50. This causes each block inside the transmitter 50 to be in an operable state.

Quite similarly, the battery 61 is fully charged, and the output voltage (the power supply voltage Vp6) of the battery 61 is higher than a predetermined voltage. Therefore, the voltage detecting section 62 of the receiver 60 turn the switch 63 into an OFF state. Further, the power supply voltage Vp6 is supplied to each block inside the receiver 60. This causes each block inside the receiver 60 to be in an operable state.

When the transmitter 50 and the receiver 60 are coupled to each other through the cable 90, the power supply voltage Vp6 that is outputted by the battery 61 of the receiver 60 is supplied to the connection detecting section 13 of the transmitter 50 through the terminal 21P, the electric wire 902, and the terminal 11D. By detecting the power supply voltage Vp6, the connection detecting section 13 determines that the receiver 60 has been coupled to the transmitter 50 through the cable 90. Thereafter, the connection detecting section 13 sets the transmitting section 14 to be in an ON state. This enables the transmitter 50 to transmit the optical signal.

At the same time, the power supply voltage Vp5 that is outputted by the battery 51 of the transmitter 50 is supplied to the connection detecting section 23 of the receiver 60 through the terminal 11P, the electric wire 901, and the terminal 21D. By detecting the power supply voltage Vp5, the connection detecting section 23 determines that the transmitter 50 has been coupled to the receiver 60 through the cable 90. Thereafter, the connection detecting section 23 sets the receiving section 24 to be in an ON state. This enables the receiver 60 to receive the optical signal.
(Case C6)

FIG. 11B illustrates an operation example of the communication system 5 in the case where the battery 61 is fully charged, and the battery 51 is not fully charged (case C6).

In the case C6, the battery 51 is not fully charged, and the output voltage of the battery 51 does not reach the predetermined voltage. Therefore, the voltage detecting section 52 of the transmitter 50 turns the switch 53 into an ON state.

In contrast, the battery 61 is fully charged, and the output voltage (the power supply voltage Vp6) of the battery 61 is higher than the predetermined voltage. Therefore, the voltage detecting section 62 of the receiver 60 turn the switch 63 into an OFF state. Further, the power supply voltage Vp6 is supplied to each block inside the receiver 60. This causes each block inside the receiver 60 to be in an operable state.

When the transmitter 50 and the receiver 60 are coupled to each other through the cable 90, the power supply voltage Vp6 that is outputted by the battery 61 of the receiver 60 is supplied to the connection detecting section 13 of the transmitter 50 through the terminal 21P, the electric wire 902, and the terminal 11D, and is further supplied to each block inside the transmitter 50 through the switch 53. This causes each block inside the transmitter 50 to be in an operable state. Further, by detecting the power supply voltage Vp6, the connection detecting section 13 determines that the receiver 60 has been coupled to the transmitter 50 through the cable 90. Thereafter, the connection detecting section 13 sets the transmitting section 14 to be in an ON state. This enables the transmitter 50 to transmit the optical signal.

The power supply voltage Vp6 that is supplied to the transmitter 50 in such a manner is further supplied to the connection detecting section 23 of the receiver 60 through the terminal 11P, the electric wire 901, and the terminal 21D. By detecting the power supply voltage Vp6, the connection detecting section 23 determines that the transmitter 50 has been coupled to the receiver 60 through the cable 90. Thereafter, the connection detecting section 23 sets the receiving section 24 to be in an ON state. This enables the receiver 60 to receive the optical signal.
(Case C7)

FIG. 11C illustrates an operation example of the communication system 5 in the case where the battery 51 is fully charged, and the battery 61 is not fully charged (case C7).

In the case C7, the battery 51 is fully charged, and the output voltage (the power supply voltage Vp5) of the battery 51 is higher than the predetermined voltage. Therefore, the voltage detecting section 52 of the transmitter 50 turn the switch 53 into an OFF state. Further, the power supply voltage Vp5 is supplied to each block inside the transmitter 50. This causes each block inside the transmitter 50 to be in an operable state.

In contrast, the battery 61 is not fully charged, and the output voltage of the battery 61 does not reach the predetermined voltage. Therefore, the voltage detecting section 62 of the receiver 60 turn the switch 63 into an ON state.

When the transmitter 50 and the receiver 60 are coupled to each other through the cable 90, the power supply voltage Vp5 that is outputted by the battery 51 of the transmitter 50 is supplied to the connection detecting section 23 of the receiver 60 through the terminal 11P, the electric wire 901, and the terminal 21D, and is further supplied to each block inside the receiver 60 through the switch 63. This causes each block inside the receiver 60 to be in an operable state. Further, by detecting the power supply voltage Vp5, the connection detecting section 23 determines that the transmitter 50 has been coupled to the receiver 60 through the cable 90. Thereafter, the connection detecting section 23 sets the receiving section 24 to be in an ON state. This enables the receiver 60 to receive the optical signal.

The power supply voltage Vp5 that is supplied to the receiver 60 in such a manner is further supplied to the connection detecting section 13 of the transmitter 50 through the terminal 21P, the electric wire 902, and the terminal 11D. By detecting the power supply voltage Vp5, the connection detecting section 13 determines that the receiver 60 has been coupled to the transmitter 50 through the cable 90. Thereafter, the connection detecting section 13 sets the transmitting section 14 to be in an ON state. This enables the transmitter 50 to transmit the optical signal.
(Case C8)

FIG. 11D illustrates an operation example of the communication system 5 in the case where both of the batteries 51 and 61 are not fully charged (case C8). In the case C8, the battery 51 is not fully charged, and the output voltage of the battery 51 does not reach the predetermined voltage. Therefore, the voltage detecting section 52 of the transmitter 50 turns the switch 53 into an ON state. In a similar manner, the battery 61 is not fully charged, and the output voltage of the battery 61 does not reach the predetermined voltage. Therefore, the voltage detecting section 62 of the receiver 60 turn the switch 63 into an ON state.

In the case C8, the battery 51 is not fully charged in the transmitter 50, and the battery 61 is not fully charged in the receiver 60. Therefore, the communication system 5 performs no operation.

As described above, the communication system 5 adopts the transmitter 50 having the battery 51 and the receiver 60 having the battery 61. This allows the communication system 5 to operate in a similar manner to the communication system 1 according to the first embodiment (FIG. 1), in the case where both of the batteries 51 and 61 are fully charged (case C5). In other words, in the case C5, the transmitter 50 operates on the basis of the power that is supplied by the battery 51 of the transmitter 50, and the receiver 60 operates on the basis of the power that is supplied by the battery 61 of the receiver 60. Further, in the case where one of the batteries 51 and 61 is fully charged, and the other is not fully charged (cases C6 and C7), the communication system 5 operates in a similar manner to the communication systems 2 and 29 according to the second embodiment (FIGS. 2 and 3). In other words, in the case C6, for example, the receiver 60 functions also as a power feeder. It is possible for receiver 60 to supply the power supply voltage Vp6 to each block inside the transmitter 50 as well as to charge the battery 51 of the transmitter 50. In addition, for example, in the case C7, the transmitter 50 functions also as a power feeder. It is possible for the transmitter 50 to supply the power supply voltage Vp5 to each block inside the receiver 60 as well as to charge the battery 61 of the receiver 60. Moreover, in the case where both of the batteries 51 and 61 are not fully charged (case C8), the communication system 5 performs no operation.

As described above, in the present embodiment, a communication system is configured by the transmitter having a battery and the receiver having a battery. Therefore, in the case where one of the two batteries is fully charged, the device having such a fully-charged battery is able to supply the power to the device having the other battery that is not fully charged. Other effects are similar to those in the cases of the above-described third and fourth embodiments.

Although description has been given of the technology, referring to some embodiments and modification examples, the technology is by no means limited to the foregoing embodiments and modification examples, and various modifications are possible.

In each of the above-described embodiments, for example, the transmitting section 14 and the receiving section 24 are coupled through the single optical fiber 904; however, this is not limitative. As an alternative, for example, as seen in a communication system 1A illustrated in FIG. 12, the transmitting section and the receiving section may be coupled through a plurality of optical fibers. The communication system 1A is configured in such a manner that this modification example is applied to the communication system 1 according to the above-described first embodiment. It is to be noted that the present modification example is not limitative and is applicable to each of the above-described embodiments. The communication system 1A includes a cable 90A, a transmitter 10A, and a receiver 20A. The cable 90A includes optical fibers 904 and 905. The optical fibers 904 and 905 serve to transmit an optical signal from the transmitter 10A to the receiver 20A. A first end of the optical fiber 904 is coupled to a terminal 11C1 of the transmitter 10A, and a second end thereof is coupled to a terminal 21C1 of the receiver 20A. A first end of the optical fiber 905 is coupled to a terminal 11C2 of the transmitter 10A, and a second end thereof is coupled to a terminal 21C2 of the receiver 20A. The transmitter 10A includes a transmitting section 14A. The transmitting section 14A includes a transmitting circuit 15A and a light-emitting section 16A. The power supply section 12, the connection detecting section 13, and the transmitting circuit 15A are integrated on a semiconductor chip 10AIC in this example. The receiver 20A includes a receiving section 24A. The receiving section 24A includes a light-receiving section 25A and a receiving circuit 26A. The power supply section 22, the connection detecting section 23, and the receiving circuit 26A are integrated on a semiconductor chip 20AIC in this example. The transmitting section 14A transmits an optical signal to the receiving section 24A through two optical fibers 904 and 905.

Further, in each of the above-described embodiments, for example, the optical signal is transmitted from the transmitter to the receiver in a single direction; however, this is not limitative. For example, as seen in a communication system 1B illustrated in FIG. 13, the optical signal may be transmitted bi-directionally. The communication system 1B is configured in such a manner that this modification example is applied to the communication system 1 according to the above-described first embodiment. It is to be noted that this is not limitative; the present modification example is applicable to each of the above-described embodiments. The communication system 1B includes the cable 90A, and communication devices 70 and 80. The cable 90A includes the optical fibers 904 and 905. The optical fiber 904 serves to transmit the optical signal from the communication device 70 to the communication device 80. The optical fiber 905 serves to transmit the optical signal from the communication device 80 to the communication device 70. The communication device 70 includes a communication section 71. The communication section 71 includes a transmitting circuit 72, a light-emitting section 73, a light-receiving section 74, and a receiving circuit 75. The power supply section 12, the connection detecting section 13, the transmitting circuit 72, and the receiving circuit 75 are integrated on a semiconductor chip 70IC in this example. The communication device 80 includes a communication section 81. The communication section 81 includes a transmitting circuit 82, a light-emitting section 83, a light-receiving section 84, and a receiving circuit 85. The power supply section 22, the connection detecting section 23, the transmitting circuit 82, and the receiving circuit 85 are integrated on a semiconductor chip 80IC in this example. The communication section 71 transmits the optical signal to the communication section 81 through the optical fiber 904, and the communication section 81 transmits the optical signal to the communication section 71 through the optical fiber 905.

In addition, in each of the above-described embodiments, for example, each pair of the terminals of the transmitter and the receiver to be coupled to each other is predetermined; however, this is not limitative. For example, a connector of the cable may be coupled to a connector of the transmitter in a reversible manner, or the connector of the cable may be coupled to a connector of the receiver in a reversible manner. Hereinafter, description is provided on a communication system 1C, as an example, that is configured in such a manner that the connector of the cable may be coupled to the connector of the receiver reversibly.

FIG. 14A illustrates an example of the communication system 1C in a certain coupling state, and FIG. 14B illustrates an example of the communication system 1C in another coupling state. The communication system 1C is configured in such a manner that this modification example is applied to the communication system 1 according to the above-described first embodiment. It is to be noted that this is not limitative; the present modification example is applicable to each of the above-described embodiments. The communication system 1C includes a cable 90C, a transmitter 10C, and a receiver 20C.

The cable 90C includes electric wires 901 to 903, and optical fibers 904 to 907. First ends of the electric wires 901 to 903 are coupled respectively to terminals 11P, 11D, and 11G of the transmitter 10C, and first ends of the optical fibers 904 to 907 are coupled respectively to terminals 11C1 to 11C4 of the transmitter 10C. Meanwhile, terminals of the receiver 20C to which second ends of the electric wires 901 to 903 and second ends of the optical fibers 904 to 907 are coupled may be different depending on a coupling state. In other words, the connector 21 of the receiver 20C includes terminals 21P1, 21P2, 21D1, 21D2, 21G1, and 21G2 for electric signals, and terminals 21C1 to 21C4 for optical signals. In an example of FIG. 14A, the second ends of the electric wires 901 to 903 are coupled respectively to the terminals 21D1, 21P1, and 21G1 of the receiver 20C, and the second ends of the optical fibers 904 to 907 are coupled respectively to the terminals 21C1 to 21C4 of the receiver 20C. Further, in an example of FIG. 14B, the second ends of the electric wires 901 to 903 are coupled respectively to the terminals 21D2, 21P2, and 21G2 of the receiver 20C, and the second ends of the optical fibers 904 to 907 are coupled respectively to the terminals 21C4 to 21C1 of the receiver 20C.

The transmitter 10C includes a transmitting section 14A. The transmitting section 14A includes a transmitting circuit 15C and a light-emitting section 16C. The power supply section 12, the connection detecting section 13, and the transmitting circuit 15C are integrated on a semiconductor chip 10CIC in this example.

The receiver 20C includes a power supply section 22, connection detecting sections 23A and 23B, and a receiving section 24C. The power supply section 22 is coupled to the terminals 21P1 and 21P2. The connection detecting sections 23A is coupled to the terminal 21D1, and the connection detecting sections 23B is coupled to the terminal 21D2. The receiving section 24C includes a light-receiving section 25C and a receiving circuit 26C. The power supply section 22, the connection detecting sections 23A and 23B, and the receiving circuit 26C are integrated on a semiconductor chip 20CIC in this example. The semiconductor chip 20CIC includes terminals 29P, 29D1, 29D2, and 29G. The terminal 29P is coupled to the terminals 21P1 and 21P2 of the connector 21; the terminal 29D1 is coupled to the terminal 21D1 of the connector 21; the terminal 29D2 is coupled to the terminal 21D2 of the connector 21; and the terminal 29G is coupled to the terminals 21G1 and 21G2 of the connector 21.

The transmitting section 14C transmits optical signals to the receiving section 24C through the four optical fibers 904 to 907. At this time, the receiving section 24C detects a coupling state (FIG. 14A or FIG. 14B) based on which of the connection detecting sections 23A and 23B has detected the power supply voltage Vp1 that is supplied from the power supply section 12 of the transmitter 10C. This enables the receiving circuit 26C to reorder four signal streams received through the optical fibers 904 to 907 on the basis of the detected coupling state.

It is to be noted that, in this example, there are provided the two connection detecting sections 23A and 23B; however, this is not limitative. For example, as seen in a communication system 1D illustrated in FIG. 15, a single connection detecting section may be used in a time-division manner. The communication system 1D includes a receiver 20D. The receiver 20D includes a connection detecting sections 23, a receiving section 24D, and a switch 28D. The receiving section 24D includes a receiving circuit 26D. The power supply section 22, the connection detecting section 23, and the receiving circuit 26D are integrated on a semiconductor chip 20DIC in this example. The receiving circuit 26D controls the switch 28D to couple the terminal 21D1 or 21D2 to the connection detecting sections 23 in the time-division manner. This allows the receiving circuit 26D to detect a coupling state (FIG. 14A or FIG. 14B).

Further, in this example, the receiver detects the coupling state; however, this is not limitative, and the transmitter may detect the coupling state alternatively. In such a case, it is possible for the transmitter to transmit the four signal streams that are reordered on the basis of the detected coupling state.

Moreover, in each of the above-described embodiments, for example, the transmission/reception operations are controlled on the basis of detection results obtained by the connection detecting sections 13 and 23; however, this is not limitative. Alternatively, for example, as seen in a communication system 1E illustrated in FIG. 16, the transmission/reception operations may be controlled on the basis of a power supply voltage that is outputted from the communication system 1E itself in addition to a result of the detections obtained by the connection detecting sections 13 and 23. The communication system 1E is configured in such a manner that this modification example is applied to the communication system 1 according to the above-described first embodiment. It is to be noted that this is not limitative; the present modification example is applicable to each of the above-described embodiments. The communication system 1E includes a cable 90, a transmitter 10E, and a receiver 20E.

The transmitter 10E includes a switch 17, a voltage detecting section 18, and a controller 100. The power supply section 12, the switch 17, the connection detecting section 13, the voltage detecting section 18, the controller 100, and the transmitting circuit 15 are integrated on a semiconductor chip 10EIC in this example. The switch 17 supplies the power supply voltage Vp1 that is generated by the power supply section 12 to the terminal 11P in an ON state, and supplies 0 V to the terminal 11P in an OFF state. The switch 17 is turned on and off on the basis of an instruction from the controller 100. The voltage detecting section 18 detects whether a voltage on the terminal 11P is the power supply voltage Vp1, and outputs a result of the detection as a signal SP1. The signal SP1 is a logic signal that becomes "1" (active) in a case where the voltage on the terminal 11P is the power supply voltage Vp1. As with each of the above-described embodiments, the connection detecting section 13 detects that the receiver 20E has been coupled to the transmitter 10E through the cable 90 on the basis of a voltage on the terminal 11D, and outputs a result of the detection as a signal SD1. The signal SD1 is a logic signal that becomes "1" (active) in a case where the transmitter 10E and the receiver 20E are coupled to each other. The controller 100 controls a transmission operation in the transmitting section 14 by supplying a signal CTL1 to the transmitting section 14 on the basis of a result of the detection (the signal SD1) obtained by the connection detecting section 13, and a result of the detection (the signal SP1) obtained by the voltage detecting section 18. Specifically, in a case where the transmitter 10E and the receiver 20E are coupled to each other and the voltage on the terminal 11P is the power supply voltage Vp1, the controller 100 sets the transmitting section 14 to be in an ON state. In other cases, the controller 100 sets the transmitting section 14 to be in an OFF state. Further, the controller 100 also has an on/off control function of the switch 17.

FIG. 17 illustrates a configuration example of a circuit that generates a signal CTL in the controller 100. The controller 100 includes an AND circuit 101, a rising edge detecting section 102, an AND circuit 103, a falling edge detecting section 104, a timer 105, a count comparator 106, and an inverting circuit 107. The AND circuit 101 obtains a logical product (AND) of the signals SD1 and SP1. The rising edge detecting section 102 detects a rising edge of an output signal from the AND circuit 101. The AND circuit 103 obtains a logical product (AND) of the output signal from the AND circuit 101 and an output signal from the inverting circuit 107. The falling edge detecting section 104 detects a falling edge of the output signal from the AND circuit 101. In a case where a signal that is supplied to an enable terminal is "1" (active), the timer 105 performs a count-up operation on the basis of a signal that is supplied to a start terminal to output a count value CNT. Meanwhile, in a case where the signal that is supplied to the enable terminal is "0" (inactive), the timer 105 holds the count value CNT. Further, the tinier 105 also has a function of resetting the count value CNT on the basis of the signal that is supplied to a reset terminal. An output signal of the rising edge detecting section 102 is supplied to the start terminal of the timer 105; an output signal of the AND circuit 103 is supplied to the enable terminal thereof; and an output signal of the falling edge detecting section 104 is supplied to the reset terminal thereof. The count comparator 106 sets the signal CTL1 at "1" in a case where the count value CNT is greater than a value CREF (CNT>CREF), and sets the signal CTL1 at "0" in a case where the count value CNT is equal to or smaller than the value CREF. The inverting circuit 107 obtains an inverting logic of the signal CTL1. With such a configuration, when both of the signals SD1 and SP1 become "1" and thereafter such a state continues during a time Δt corresponding to the value CREF, the controller 100 changes the signal CTL1 from a low level to a high level. Subsequently, when one or both of the signals SD1 and SP1 become "0", the controller 100 changes the signal CTL1 from a high level to a low level.

The receiver 20E includes a switch 27, a voltage detecting section 28, and a controller 200. The power supply section 22, the switch 27, the connection detecting section 23, the voltage detecting section 28, the controller 200, and the receiving circuit 26 are integrated on a semiconductor chip 20EIC in this example. The switch 27 supplies the power supply voltage Vp2 that is generated by the power supply section 22 to the terminal 21P in an ON state, and supplies 0 V to the terminal 21P in an OFF state. The switch 17 is turned on and off on the basis of an instruction from the controller 200. The voltage detecting section 28 detects whether a voltage on the terminal 21P is the power supply voltage Vp2, and outputs a result of the detection as a signal SP2. As with each of the above-described embodiments, the connection detecting section 23 detects that the transmitter 10E has been coupled to the receiver 20E through the cable 90 on the basis of a voltage on the terminal 21D, and outputs a result of the detection as a signal SD2. The controller 200 controls a reception operation in the receiving section 24 by supplying a signal CTL2 to the receiving section 24 on the basis of a result of the detection (the signal SD2) obtained by the connection detecting section 23, and a result of the detection (the signal SP2) obtained by the voltage detecting section 28. Further, the controller 200 also has an on/off control function of the switch 27. A configuration of the controller 200 is similar to that of the controller 100 (FIG. 17).

Here, for example, the semiconductor chip 10EIC corresponds to a specific example of the "communication device" in the disclosure. Each of the connection detecting section 13, the voltage detecting section 18, and the controller 100 corresponds to a specific example of the "communication controller" in the disclosure. The switch 17 corresponds to a specific example of the "power switch" in the disclosure.

FIG. 18 illustrates an operation example of the communication system 1E. (A) of FIG. 18 illustrates a waveform of the signal SP1; (B) illustrates a waveform of the signal SD1; (C) illustrates a waveform of the signal CTL1; (D) illustrates a waveform of the signal SP2; (E) illustrates a waveform of the signal SD2; and (F) illustrates a waveform of the signal CTL2. In this example, in a timing t1, power of the transmitter 10E is turned on, and the voltage detecting section 18 changes the signal SP1 from a low level to a high level ((A) of FIG. 18). Similarly, in a timing t2, power of the receiver 20E is turned on, and the voltage detecting section 28 changes the signal SP2 from a low level to a high level ((D) of FIG. 18). Thereafter, in a timing t3, the transmitter 10E and the receiver 20E are coupled to each other through the cable 90. As a result, the connection detecting section 13 of the transmitter 10E changes the signal SD1 from a low level to a high level ((B) of FIG. 18), and the connection detecting section 23 of the receiver 20E changes the signal SD2 from a low level to a high level ((E) of FIG. 18). During a period from the timing t3 when both of the signals SP1 and SD1 become "1" until a timing t4 when the time Δt corresponding to the value CREF has elapsed, the controller 100 of the transmitter 10E changes the signal CTL1 from a low level to a high level ((C) of FIG. 18). Accordingly, the transmitting section 14 starts a transmission operation. In a similar manner, during a period from the timing t3 when both of the signals SP2 and SD2 become "1" until the timing t4 when the time Δt corresponding to the value CREF has elapsed, the controller 200 of the receiver 20E changes the signal CTL2 from a low level to a high level ((F) of FIG. 18). As a result, the receiving section 24 starts the reception operation.

Thereafter, in this example, due to a certain cause, in a timing t5, the transmitter 10E may be unable to receive supply of the power supply voltage Vp2 from the receiver 20E. As a result, the connection detecting section 13 of the transmitter 10E changes the signal SD1 from a high level to a low level ((B) of FIG. 18). Accordingly, the controller 100 of the transmitter 10E changes the signal CTL1 from a high level to a low level ((C) of FIG. 18). Consequently, the transmitting section 14 stops the transmission operation. To notify the receiver 20E that the supply of the power supply voltage Vp2 has been stopped, the controller 100 stops supply of the power supply voltage Vp1 to the receiver 20E by turning the switch into an OFF state during a period of timings t6 to t8. As a result, in the timing t6, the connection detecting section 23 of the receiver 20E changes the signal SD2 from a high level to a low level ((E) of FIG. 18). Accordingly, the controller 200 of the receiver 20E changes the signal CTL2 from a high level to a low level ((F) of FIG. 18). Consequently, the receiving section 24 stops the reception operation. In this example, in the timing t7 within the period of the timings t6 to t8, the cause of inability to receive the supply of the power supply voltage Vp2 is resolved, and the transmitter 10E receives the supply of the power supply voltage Vp2 from the receiver 20E. As a result, the connection detecting section 13 of the transmitter 10E changes the signal SD1 from a low level to a high level ((B) of FIG. 18).

In the timing t8, the switch 17 is turned on, and the power supply voltage Vp1 starts to be supplied to the receiver 20E. At this time, the voltage detecting section 18 of the transmitter 10E changes the signal SP1 from a low level to a high level ((A) of FIG. 18), and the connection detecting section 23 of the receiver 20E changes the signal SD2 from a low level to a high level ((E) of FIG. 18). During a period from the timing t8 when both of the signals SP1 and SD1 become "1" until a timing t9 when the time Δt corresponding to the value CREF has elapsed, the controller 100 of the transmitter 10E changes the signal CTL1 from a low level to a high level ((C) of FIG. 18). Consequently, the transmitting section 14 restarts the transmission operation. In a similar manner, during a period from the timing t8 when both of the signals SP2 and SD2 become "1" until the timing t9 when the time Δt corresponding to the value CREF has elapsed, the controller 200 of the receiver 20E changes the signal CTL2 from a low level to a high level ((F) of FIG. 18). As a result, the receiving section 24 restarts the reception operation.

As described above, in the communication system 1E according to the present modification example, there are provided the switches 17 and 27 that turn on and off the supply of the power supply voltage to the communication peer, and the transmission/reception operations are controlled on the basis of the power supply voltage that is outputted from the communication system 1E itself in addition to the detection results obtained by the connection detecting sections 13 and 23. As a result, even in a case where the connection becomes unstable due to a certain cause as observed during the period of the timings t5 to t7, it is possible to effectively control the transmission/reception operations. That is, for example, in a case where the transmitting section is turned on and off on the basis of only a result of the detection obtained by the connection detecting section 13, the transmitting section 14 restarts the transmission operation in the timing t7 when the signal SD1 changes from a low level to a high level, and the receiving section 24 restarts the reception operation in the timing t8 when the signal SD2 changes from a low level to a high level. In other words, the transmitting section 14 and the receiving section 24 restart the transmission/reception operations at different timings from each other. As a result, there is a possibility that the communication may not be carried out regularly; for example, the receiving section 24 may be unable to receive a portion of data transmitted from the transmitting section 14. In contrast, in the communication system 1E, the transmission/reception operations are controlled on the basis of the power supply voltage that is outputted from the communication system 1E itself in addition to the detection results obtained by the connection detecting sections 13 and 23, thus allowing the transmitting section 14 and the receiving section 24 to restart the transmission/reception operations at an almost similar timing. As a result, it is possible for the communication system 1E to perform communication more reliably.

It is to be noted that, in this example, the controller 100 of the transmitter 10E turns off the switch 17 based on the change of the signal SD1 from a high level to a low level; however, this is not limitative. The same holds true also for the controller 200 of the receiver 20E. For example, the controller 200 of the receiver 20E may further turn off the switch 27 in a case where the receiving section 24 is unable to receive data.

Further, in this example, there are provided the switches 17 and 27; however, this is not limitative. Alternatively, for example, no switches 17 and 27 may be provided, and the power supply section 12 may generate the power supply voltage Vp1 or stop generation of the power supply voltage Vp1 on the basis of an instruction from the controller 100. Likewise, the power supply section 22 may generate the power supply voltage Vp2 or stop generation of the power supply voltage Vp2 on the basis of an instruction from the controller 200.

It is to be noted that the effects described herein are mere examples and non-limiting, and may further include other effects.

It is to be noted that the technology may be configured as follows.

(1)
A communication device including:
a first terminal that outputs a power supply voltage;
a second terminal coupled directly or indirectly to the first terminal;
a communication section that operates on a basis of the power supply voltage to communicate with a communication peer; and
a communication controller that sets the communication section to be in an ON state or in an OFF state on a basis of a voltage on the second terminal.

(2)
The communication device according to (1), in which the second terminal is coupled directly to the first terminal.

(3)
The communication device according to (2), in which the power supply voltage is supplied to the second terminal from the communication peer.

(4)
The communication device according to (1), further including a switch inserted between the first terminal and the second terminal, the switch being turned into an ON state to cause the second terminal to be coupled to the first terminal.

(5)
The communication device according to (4), further including a switch controller that turns on and off the switch on a basis of a voltage level of the first terminal.

(6)
The communication device according to (5), in which the switch controller turns the switch into the ON state in a case where the voltage level of the first terminal is lower than a predetermined level, and turns the switch into the OFF state in a case where the voltage level of the first terminal is higher than the predetermined level.

(7)
The communication device according to (5) or (6), further including a voltage supply section coupled to the first terminal.

(8)
The communication device according to (5) or (6), in which a voltage supply section is coupled to the first terminal.

(9)
The communication device according to 8 in which the voltage supply section includes a battery.

(10)
The communication device according to (9), in which
the battery supplies the power supply voltage to the first terminal, and
the switch controller turns the switch into the OFF state in a case where the power supply voltage is higher than the predetermined level.

(11)
The communication device according to (9) or (10), in which the battery is charged by the communication peer through the second terminal in a case where the switch is in the ON state.

(12)
The communication device according to any one of (1) to (11), in which the communication section communicates with the communication peer through optical communication.

(13)
The communication device according to (12), in which the communication section is able to be coupled to the communication peer in a plurality of coupling states different from one another through a plurality of communication lanes.

(14)
The communication device according to (13), in which the communication section obtains the coupling states on a basis of a voltage on the second terminal.

(15)
The communication device according to any one of (1) to (14), in which the communication controller sets the communication section to be in the ON state or in the OFF state on a basis of a voltage on the first terminal in addition to the voltage on the second terminal.

(16)
The communication device according to (15), in which the communication controller sets the communication section to be in the ON state when a state in which the voltage on the second terminal is a predetermined first voltage and the voltage on the first terminal is a predetermined second voltage continues for a predetermined time.

(17)

The communication device according to any one of (1) to (16), further including a power switch that is turned into an ON state to supply the power supply voltage to the first terminal.

(18)

The communication device according to (17), in which the communication controller further turns the power switch into an OFF state during a predetermined period of time on the basis of the voltage on the second terminal.

(19)

The communication device according to (17) or (18), in which the communication controller further turns the power switch into the OFF state during the predetermined period of time on a basis of a communication state in the communication section.

(20)

A communication system including:
a first communication device; and
a second communication device that communicates with the first communication device, the first communication device including
a first terminal that outputs a first power supply voltage,
a second terminal coupled directly or indirectly to the first terminal,
a first communication section that operates on a basis of the first power supply voltage, and
a first communication controller that sets the first communication section to be in an ON state or in an OFF state on a basis of a voltage on the second terminal.

(21)

The communication system according to (20), in which the second communication device includes
a third terminal coupled to the second terminal of the first communication device, the third terminal outputting a second power supply voltage,
a fourth terminal coupled to the first terminal of the first communication device, the fourth terminal being coupled directly or indirectly to the third terminal,
a second communication section that operates on a basis of the second power supply voltage to communicate with the first communication section, and
a second communication controller that sets the second communication section to be in an ON state or in an OFF state on a basis of a voltage on the fourth terminal.

(22)

The communication system according to (20), in which the second communication device includes
a power supply section that generates a second power supply voltage,
a third terminal coupled to the second terminal of the first communication device, the third terminal outputting the second power supply voltage,
a fourth terminal coupled to the first terminal of the first communication device,
a second communication section that communicates with the first communication section, and
a second communication controller that sets the second communication section to be in an ON state or in an OFF state on a basis of a voltage on the fourth terminal.

(23)

The communication system according to (22), in which
the power supply section further generates a third power supply voltage, and
the second communication section operates on a basis of the third power supply voltage.

(24)

A communication system including:
a first communication device; and
a second communication device that communicates with the first communication device, the first communication device including
a first power supply section that generates a first voltage,
a first terminal that outputs the first voltage,
a second terminal,
a first communication section, and
a first communication controller that sets the first communication section to be in an ON state or in an OFF state on a basis of a voltage on the second terminal,
the second communication device including
a second power supply section that generates a second voltage,
a third terminal coupled to the second terminal of the first communication device, the third terminal outputting the second voltage,
a fourth terminal coupled to the first terminal of the first communication device,
a second communication section that communicates with the first communication section, and
a second communication controller that sets the second communication section to be in an ON state or in an OFF state on a basis of a voltage on the fourth terminal.

This application claims the priority on the basis of Japanese Patent Application No. 2015-064082 filed on Mar. 26, 2015 with Japan Patent Office, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. A communication device comprising:
a first terminal that outputs a power supply voltage;
a second terminal coupled directly or indirectly to the first terminal;
a communication section that operates on a basis of the power supply voltage to communicate with a communication peer;
a communication controller that sets the communication section to be in an ON state or in an OFF state on a basis of a voltage on the second terminal; and
a switch inserted between the first terminal and the second terminal, the switch being turned into an ON state to cause the second terminal to be coupled to the first terminal.

2. The communication device according to claim 1, wherein the second terminal is coupled directly to the first terminal.

3. The communication device according to claim 2, wherein the power supply voltage is supplied to the second terminal from the communication peer.

4. The communication device according to claim 1, further comprising a switch controller that turns on and off the switch on a basis of a voltage level of the first terminal.

5. The communication device according to claim 4, wherein the switch controller turns the switch into the ON state in a case where the voltage level of the first terminal is lower than a predetermined level, and turns the switch into the OFF state in a case where the voltage level of the first terminal is higher than the predetermined level.

6. The communication device according to claim 4, further comprising a voltage supply section coupled to the first terminal.

7. The communication device according to claim 4, wherein a voltage supply section is coupled to the first terminal.

8. The communication device according to claim 7, wherein the voltage supply section comprises a battery.

9. The communication device according to claim 8, wherein
the battery supplies the power supply voltage to the first terminal, and
the switch controller turns the switch into the OFF state in a case where the power supply voltage is higher than the predetermined level.

10. The communication device according to claim 8, wherein the battery is charged by the communication peer through the second terminal in a case where the switch is in the ON state.

11. The communication device according to claim 1, wherein the communication controller sets the communication section to be in the ON state or in the OFF state on a basis of a voltage on the first terminal in addition to the voltage on the second terminal.

12. The communication device according to claim 11, wherein the communication controller sets the communication section to be in the ON state when a state in which the voltage on the second terminal is a predetermined first voltage and the voltage on the first terminal is a predetermined second voltage continues for a predetermined time.

13. The communication device according to claim 1, further comprising a power switch that is turned into an ON state to supply the power supply voltage to the first terminal.

14. The communication device according to claim 13, wherein the communication controller further turns the power switch into an OFF state during a predetermined period of time on the basis of the voltage on the second terminal.

15. The communication device according to claim 13, wherein the communication controller further turns the power switch into the OFF state during the predetermined period of time on a basis of a communication state in the communication section.

16. A communication device comprising:
a first terminal that outputs a power supply voltage;
a second terminal coupled directly or indirectly to the first terminal;
a communication section that operates on a basis of the power supply voltage to communicate with a communication peer; and
a communication controller that sets the communication section to be in an ON state or in an OFF state on a basis of a voltage on the second terminal,
wherein the communication section communicates with the communication peer through optical communication, and
wherein the communication section is able to be coupled to the communication peer in a plurality of coupling states different from one another through a plurality of communication lanes.

17. The communication device according to claim 16, wherein the communication section obtains the coupling states on a basis of a voltage on the second terminal.

18. A communication system comprising:
a first communication device; and
a second communication device that communicates with the first communication device,
the first communication device including
a first terminal that outputs a first power supply voltage,
a second terminal coupled directly or indirectly to the first terminal,
a first communication section that operates on a basis of the first power supply voltage, and
a first communication controller that sets the first communication section to be in an ON state or in an OFF state on a basis of a voltage on the second terminal; and
the second communication device including
a third terminal coupled to the second terminal of the first communication device, the third terminal outputting a second power supply voltage,
a fourth terminal coupled to the first terminal of the first communication device, the fourth terminal being coupled directly or indirectly to the third terminal,
a second communication section that operates on a basis of the second power supply voltage to communicate with the first communication section, and
a second communication controller that sets the second communication section to be in an ON state or in an OFF state on a basis of a voltage on the fourth terminal.

19. The communication system according to claim 18, wherein the second communication device includes
a power supply section that generates the second power supply voltage.

20. The communication system according to claim 19, wherein
the power supply section further generates a third power supply voltage, and
the second communication section operates on a basis of the third power supply voltage.

21. A communication system comprising:
a first communication device; and
a second communication device that communicates with the first communication device, the first communication device including
a first power supply section that generates a first voltage,
a first terminal that outputs the first voltage,
a second terminal,
a first communication section, and
a first communication controller that sets the first communication section to be in an ON state or in an OFF state on a basis of a voltage on the second terminal, the second communication device including
a second power supply section that generates a second voltage,
a third terminal coupled to the second terminal of the first communication device, the third terminal outputting the second voltage,
a fourth terminal coupled to the first terminal of the first communication device,
a second communication section that communicates with the first communication section, and
a second communication controller that sets the second communication section to be in an ON state or in an OFF state on a basis of a voltage on the fourth terminal.

* * * * *